(12) United States Patent
Lim et al.

(10) Patent No.: US 11,758,795 B2
(45) Date of Patent: Sep. 12, 2023

(54) DISPLAY DEVICE AND MANUFACTURING METHOD THEREOF

(71) Applicant: SAMSUNG DISPLAY CO., LTD., Yongin-si (KR)

(72) Inventors: Jae Ik Lim, Yongin-si (KR); Gee Bum Kim, Yongin-si (KR); Byung Han Yoo, Yongin-si (KR); Dae Young Lee, Yongin-si (KR); Chaun Gi Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 277 days.

(21) Appl. No.: 17/093,902

(22) Filed: Nov. 10, 2020

(65) Prior Publication Data

US 2021/0210557 A1 Jul. 8, 2021

(30) Foreign Application Priority Data

Jan. 8, 2020 (KR) .................. 10-2020-0002704

(51) Int. Cl.
| | |
|---|---|
| *G06V 40/13* | (2022.01) |
| *H10K 65/00* | (2023.01) |
| *H10K 39/32* | (2023.01) |
| *H10K 59/12* | (2023.01) |
| *H10K 59/40* | (2023.01) |
| *G06F 3/041* | (2006.01) |

(52) U.S. Cl.
CPC ......... *H10K 65/00* (2023.02); *G06V 40/1318* (2022.01); *H10K 39/32* (2023.02); *H10K 59/12* (2023.02); *H10K 59/40* (2023.02); *G06F 3/0412* (2013.01)

(58) Field of Classification Search
CPC ... H01L 27/288; H01L 27/307; H01L 27/323; H01L 27/3244; G06V 40/1318; G06F 3/0412
See application file for complete search history.

(56) References Cited

U.S. PATENT DOCUMENTS

| | | | |
|---|---|---|---|
| 8,994,690 B2 | 3/2015 | Shi et al. | |
| 10,181,070 B2 | 1/2019 | Smith et al. | |
| 2017/0220838 A1* | 8/2017 | He | ................ G06F 3/042 |
| 2017/0242549 A1* | 8/2017 | Lim | ............... G06F 3/0421 |
| 2018/0060641 A1* | 3/2018 | Kim | ............. G06V 40/1324 |
| 2018/0239455 A1* | 8/2018 | Jia | ................ G06V 40/13 |

FOREIGN PATENT DOCUMENTS

| | | | | |
|---|---|---|---|---|
| CN | 108885693 A | * | 11/2018 | .......... G02B 27/30 |
| KR | 2018034750 A | * | 4/2018 | ......... G02B 6/0088 |
| KR | 20190053732 A | | 5/2019 | |

* cited by examiner

*Primary Examiner* — Stephen G Sherman
(74) *Attorney, Agent, or Firm* — F. CHAU & ASSOCIATES, LLC

(57) ABSTRACT

A display device includes a fingerprint sensor layer that receives light reflected by an external object; a substrate disposed on the fingerprint sensor layer; an optical pattern layer disposed on the substrate and that includes a light blocking portion and a light transmitting portion that passes through the light blocking portion in one direction; a first light transmitting layer with a first refractive index and that is disposed on the light blocking portion; a second light transmitting layer with a second refractive index different from the first refractive index and that is disposed on the first light transmitting layer; and a light emitting element layer disposed on the second light transmitting layer.

10 Claims, 17 Drawing Sheets

DISPLAY DEVICE AND MANUFACTURING METHOD THEREOF

CROSS-REFERENCE TO RELATED APPLICATION

This application claims priority under 35 USC § 119 from, and the benefit of, Korean Patent Application No. 10-2020-0002704, filed in the Korean Intellectual Property Office on Jan. 8, 2020, the contents of which are herein incorporated by reference in their entirety.

BACKGROUND

1. Technical Field

Embodiments of the present disclosure are directed to a display device and a manufacturing method thereof, and more particularly, to a display device that includes a fingerprint sensor and a manufacturing method thereof.

2. Discussion of the Related Art

As an information society develops, the demand for display devices in various forms for displaying images has increased. For example, display devices are implemented in various electronic devices, such as a smart phone, a digital camera, a laptop computer, a navigation, or a smart television. A display device may be a flat panel display such as a liquid crystal display device, a field emission display device, an organic light emitting display device, etc.

An organic light emitting display device displays an image using an organic light emitting element (OLED) that emits light by recombining electrons and holes. An organic light emitting display device has a fast response speed, a high luminance and a large viewing angle, and has low power consumption.

Recently, a technology has been developed for integrating a sensor for fingerprint recognition on a display panel that occupies the largest area in the display device.

SUMMARY

An exemplary embodiment of the present disclosure provides a display device and a manufacturing method thereof with improved light transmittance and improved fingerprint recognition performance.

The objects of the present disclosure are not limited to the object mentioned above, and other technical objects that are not mentioned may be clearly understood to a person of an ordinary skill in the art using the following description.

A display device according to an exemplary embodiment of the present disclosure includes a fingerprint sensor layer that receives light reflected by an external object; a substrate disposed on the fingerprint sensor layer; an optical pattern layer disposed on the substrate and that includes a light blocking portion and a light transmitting portion that passes through the light blocking portion in one direction; a first light transmitting layer with a first refractive index and that is disposed on the light blocking portion; a second light transmitting layer with a second refractive index that differs from the first refractive index and that is disposed on the first light transmitting layer; and a light emitting element layer disposed on the second light transmitting layer.

The first light transmitting layer may include an opening that overlaps the light transmitting portion, and the second light transmitting layer may fill the light transmitting portion and the opening of the first light transmitting layer.

The first refractive index may be greater than the second refractive index.

The first light transmitting layer may include at least one of an inorganic material layer that contains at least one of silicon nitride (SiNx), silicon oxy nitride (SiON), silicon oxide (SiOx), titanium oxide (TiOx), or aluminum oxide (AlOx), or an organic material layer that contains an inorganic particle.

The second light transmitting layer may contain a transparent organic material.

A refractive index ratio of the first light transmitting layer and the second light transmitting layer may be expressed by refractive index ratio=the second refractive index/the first refractive index, and may be 0.9775 or less.

The light blocking portion includes at least one of an organic blocking material or a metal blocking material.

The display device may further include a lens layer disposed between the second light transmitting layer and the light emitting element layer and that includes an inclined surface, wherein the inclined surface of the lens layer may overlap the light blocking portion, and light reflected by the external object and that is incident on the inclined surface may be refracted toward the light transmitting portion.

The display device may further include a first lens layer disposed between the substrate and the optical pattern layer and that includes a first inclined surface, wherein the fingerprint sensor layer may include a plurality of light receiving elements, the inclined surface may overlap an area between the plurality of light receiving elements, and light transmitting the light transmitting portion and that is incident on the first inclined surface may be refracted toward at least one of the plurality of light receiving elements.

The display device may further include a second lens layer disposed between the second light transmitting layer and the light emitting element layer and that includes a second inclined surface, wherein the second inclined surface of the second lens layer may overlap the light blocking portion, and light reflected by the external object and that is incident on the second inclined surface may be refracted toward the light transmitting portion.

A display device according to another exemplary embodiment of the present disclosure includes a fingerprint sensor layer that receives light reflected by an external object; a substrate disposed on the fingerprint sensor layer; an optical pattern layer disposed on the substrate and that includes a light blocking portion and a light transmitting portion that passes through the light blocking portion in one direction; a light emitting element layer disposed on the optical pattern layer; a first lens layer that has a first refractive index and that is disposed on one of an area between the optical pattern layer and the light emitting element layer or an area between the optical pattern layer and the substrate; and a planarization layer disposed on the first lens layer and that has a second refractive index less than the first refractive index, wherein the first lens layer includes a first inclined surface.

The first lens layer may include an upper surface and a lower surface parallel to the upper surface, and the first inclined surface may be disposed between the upper surface and the lower surface, and an angle between the first inclined surface and the lower surface is an acute angle.

The first lens layer may be disposed on the optical pattern layer, the first inclined surface of the first lens layer may overlap the light blocking portion, and light reflected by the external object and that is incident on the first inclined surface of the first lens layer may be refracted toward the light transmitting portion.

The first lens layer may be disposed under the optical pattern layer, the fingerprint sensor layer may include a plurality of light receiving elements, the first inclined surface of the first lens layer may overlap an area between the plurality of light receiving elements, and light transmitting the light transmitting portion and that is incident on the first inclined surface may be refracted toward at least one of the plurality of light receiving elements.

The display device may further include a second lens layer disposed between the optical pattern layer and the light emitting element layer and that includes a second inclined surface, wherein the second inclined surface of the second lens layer may overlap the light blocking portion, and light reflected by the external object and that is incident on the second inclined surface may be refracted toward the light transmitting portion.

A method of manufacturing a display device according to an exemplary embodiment of the present disclosure includes forming a light blocking material layer on a substrate; forming a first light transmitting layer on the light blocking material layer; etching the light blocking material layer by using the first light transmitting layer as a mask to form a light blocking portion of an optical pattern layer and a light transmitting portion of the optical pattern layer; and forming a second light transmitting layer on the substrate wherein the light transmitting portion is filled and the first light transmitting layer is covered; providing a display panel on the second light transmitting layer; and providing a fingerprint sensor layer under the substrate.

A refractive index of the first light transmitting layer may be greater than a refractive index of the second light transmitting layer.

The first light transmitting layer may includes at least one of an inorganic material layer that contains at least one of silicon nitride (SiNx), silicon oxy nitride (SiON), silicon oxide (SiOx), titanium oxide (TiOx), or aluminum oxide (AlOx), or an organic material layer that contains an inorganic particle.

The second light transmitting layer contains a transparent organic material.

The light blocking portion includes at least one of an organic blocking material or a metal blocking material.

According to a display device and a manufacturing method thereof according to exemplary embodiments of the present disclosure, a refractive pattern layer is formed on an optical pattern layer to improve light transmittance to a light receiving element while maintaining the same cut-off angle. Accordingly, a fingerprint recognition performance of the display device that includes a fingerprint sensor is improved.

In addition, according to a display device and a manufacturing method thereof according to exemplary embodiments of the present disclosure, a refractive pattern layer that has a lens layer is formed on or under an optical pattern layer to improve light reception efficiency of a light receiving element. Accordingly, a fingerprint recognition performance of a display device that includes a fingerprint sensor is further improved.

DETAILED DESCRIPTION OF EXEMPLARY EMBODIMENTS

Figure 1:
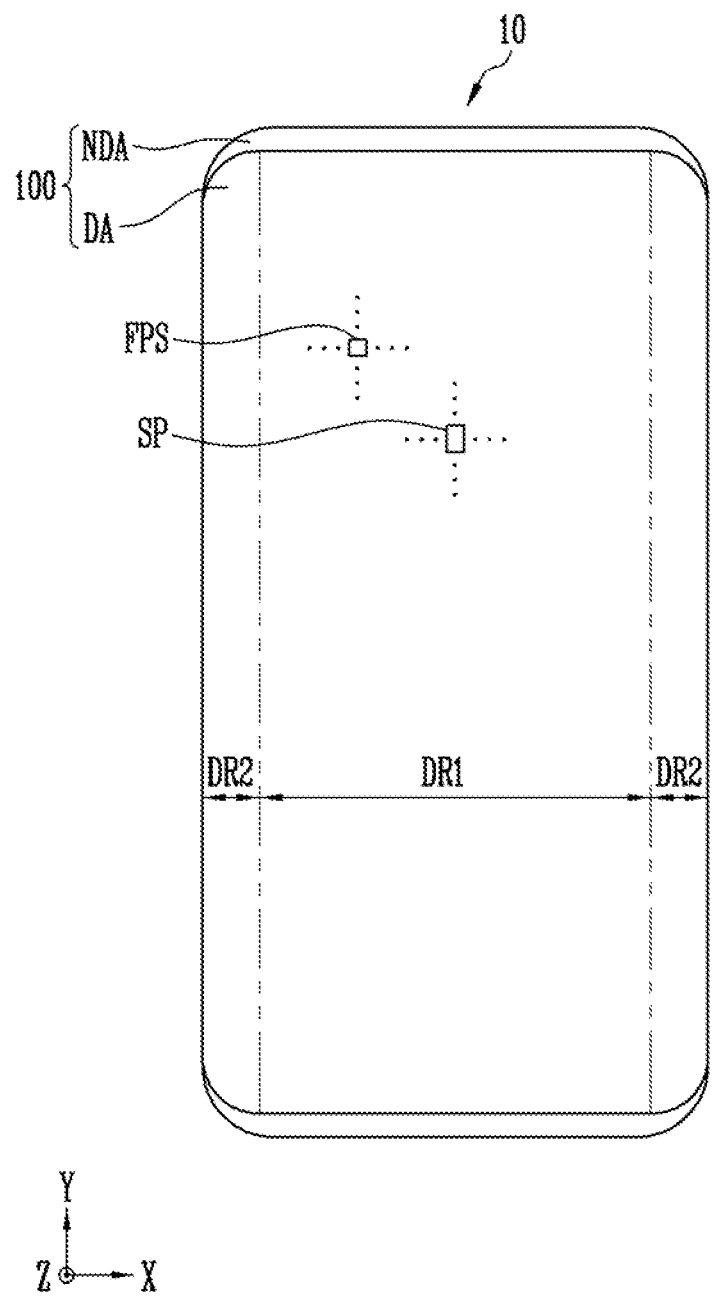
FIG. 1 is a top plan view of a display device according to an exemplary embodiment.

Features of embodiments of the present disclosure, and implementation methods thereof will be clarified through exemplary embodiments described with reference to the accompanying drawings. Embodiments of the present disclosure may, however, be implemented in different forms and should not be construed as limited to the embodiments set forth herein. Rather, these embodiments are provided so that this disclosure will be thorough and complete, and will fully convey the scope of the present disclosure to those skilled in the art. Further, embodiments of the present disclosure are defined by scopes of claims.

It will be understood that when an element or a layer is referred to as being 'on' another element or layer, it can be directly on another element or layer, or intervening element or layer may also be present. The same reference numerals may designate the same elements throughout the specification. The shapes, sizes, ratios, angles, numbers, and the like disclosed in the drawings for describing embodiments of the present disclosure are illustrative, and thus embodiments of the present disclosure is not limited to the illustrated embodiments.

FIG. 1 is a top plan view of a display device according to an exemplary embodiment.

In the present specification, "upper", "top", and "on" refer to a upward direction, that is, a Z-axis direction with respect to the display device 10, and "lower", "bottom", and "under" refer to a downward direction, that is, the direction opposite to the Z-axis direction, with respect to the display device 10. In addition, "left", "right", "up", and "down" refer to a direction when viewing a display device 10 from above.

Referring to FIG. 1, according to an embodiment, a display device 10 can display a moving image or a still image, and can be used as a display screen of various products such as a television, a notebook, a monitor, a billboard, an internet of things (IOT), etc., as well as a portable electronic device such as a mobile phone, a smart phone, a tablet pc or a tablet watch, a watch phone, a mobile communication terminal, an electron notebook, an electron book, a portable multimedia player (PMP), a navigation, an ultra-mobile pc (UMPC), etc.

According to an embodiment, the display device 10 includes a first area DR1 and a second area DR2. The first area DR1 is flat and the second area DR2 extends from left and right sides of the first area DR1. For example, the second area DR2 may be flat or curved. When the second area DR2 is flat, an angle formed by the first area DR1 and the second area DR2 is an obtuse angle. When the second area DR2 is curved, the second area DR2 may have a constant curvature or a varying curvature.

According to an embodiment, the second area DR2 extends from each of the left and right sides of the first area DR1, but embodiments are not limited thereto. For example, in other embodiments, the second area DR2 extends only from one of the left or right sides of the first area DR1. In still other embodiments, the second area DR2 extends from at least one of the upper and lower sides as well as from the left and right sides of the first area DR1.

According to an embodiment, the display device 10 includes a display panel 100 that displays an image. The display panel 100 includes a display area DA and a non-display area NDA.

According to an embodiment, the display area DA displays an image and includes a plurality of sub-pixels SP. In addition, the display area DA can be used for detecting an external environment. For example, the display area DA corresponds to a fingerprint recognition area for recognizing a fingerprint of a user. Therefore, the display area DA includes a plurality of sub-pixels SP and a plurality of fingerprint sensors FPS. The display area DA is used to display an image and recognize a user's fingerprint. For example, a display panel on which a plurality of sub-pixels SP are disposed overlaps a fingerprint sensor layer on which a plurality of fingerprint sensors FPS are disposed.

According to an embodiment, the non-display area NDA is the remaining area of the display panel 100, except for the display area DA. For example, the non-display area NDA includes a scan driver that transmits scan signals to scan lines, fan out lines that connect data lines and a display driver, and pads connected to a circuit board.

For example, according to an embodiment, the non-display area NDA is opaque. The non-display area NDA has a deco layer with a pattern that is visible to the user.

Figure 2:
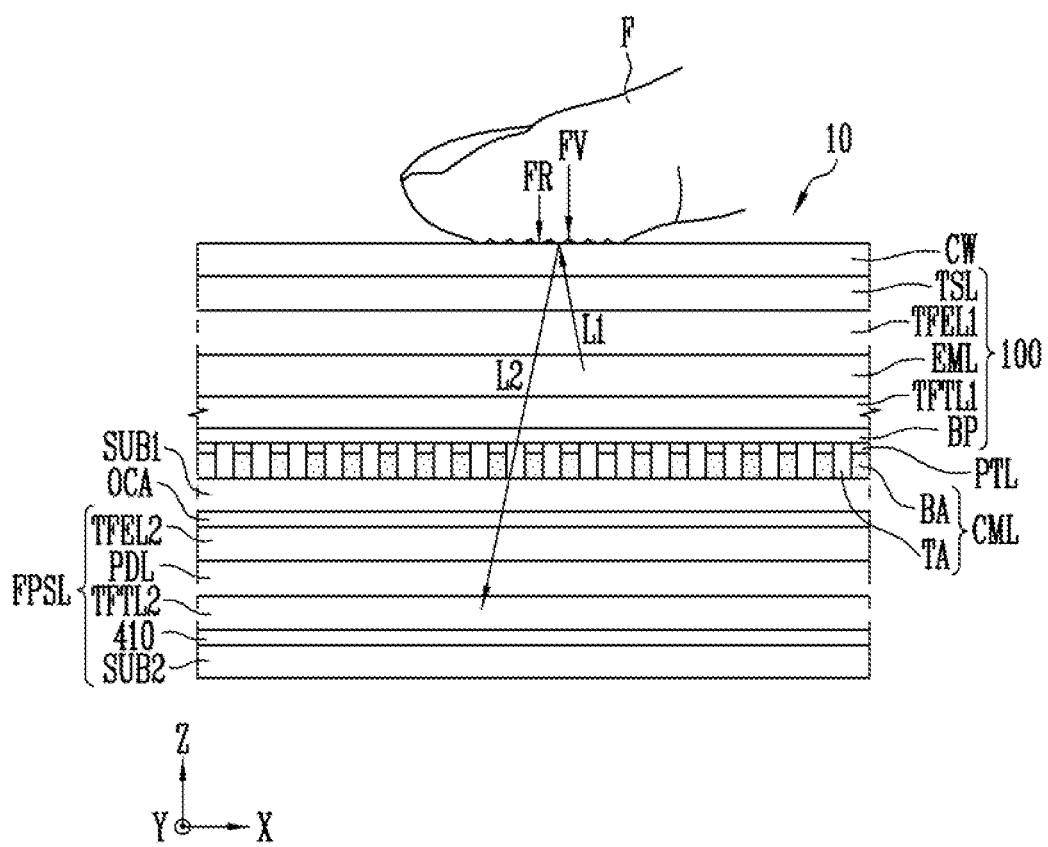
FIG. 2 is a cross-sectional view of a display device according to an exemplary embodiment.

FIG. 2 is a cross-sectional view of a display device according to an exemplary embodiment.

Referring to FIG. 2, according to an embodiment, the display device 10 includes a first substrate SUB1, an optical pattern layer CML, a refractive pattern layer PTL, a display panel 100, a cover window CW, and a fingerprint sensor layer FPSL.

According to an embodiment, the first substrate SUB1 is a base substrate and is formed of an insulation material such as a polymer resin, etc. For example, the first substrate SUB1 is formed of one or more of polyethersulfone (PES), polyacrylate (PAC), polyarylate (PAR), polyetherimide (PEI), polyethylene naphthalate (PEN), polyethylene terepthalate (PET), polyphenylene sulfide (PPS), polyimide (PI), polycarbonate (PC), cellulose triacetate (CTA), cellulose acetate propionate (CAP), or a combination thereof.

For example, according to an embodiment, the first substrate SUB1 is a flexible substrate that can bend, fold, roll, etc. When the first substrate SUB1 is flexible, it may be formed of polyimide (PI), but embodiments are not limited thereto.

According to an embodiment, the optical pattern layer CML is disposed on the first substrate SUB1. The optical pattern layer CML can distinguish light reflected by a ridge FR of the user's finger F from light reflected by a valley FV thereof and provide it to a separate a light receiving element. To this end, the optical pattern layer CML includes a light blocking portion BA and a plurality of light transmitting portions TA that penetrate the light blocking portion BA in the Z-direction. In an embodiment, the plurality of light transmitting portions TA are holes that penetrate the light blocking portion BA.

According to an embodiment, the light blocking portion BA includes at least one of an organic blocking material or a metal blocking material. For example, the organic blocking material may be at least one of carbon black (CB) or titanium black (TiBK), but embodiments are not limited thereto. In addition, the metal blocking material may include at least one of chromium, chromium oxide or chromium nitride, but embodiments are not limited thereto.

According to an embodiment, plurality of light transmitting portions TA provide an optical path for a second light L2, which is first light L1 emitted from the light emitting element layer EML that has been reflected by the user's body and which propagates to the fingerprint sensor layer FPSL.

According to an embodiment, the light blocking portion BA overlaps a plurality of thin film transistors of a first thin film transistor layer TFTL1 of the display panel 100, but the plurality of light transmitting portions TA do not overlap the plurality of thin film transistors of the first thin film transistor layer TFTL1. For example, the plurality of light transmitting portions TA are arranged in a first direction (or X-axis direction) and a second direction (or Y-axis direction) that crosses the first direction. A size of each of the plurality of light transmitting portion TA is determined by the optical path of the second light L2.

According to an embodiment, a detailed description of the light blocking portion BA and the light transmitting portion TA will be provided below with reference to FIGS. 3 to 6.

According to an embodiment, the refractive pattern layer PTL is disposed on the optical pattern layer CML. The refractive pattern layer PTL adjusts a path of the second light L2 by refracting at least a portion of the second light L2 that is propagating to the fingerprint sensor layer FPSL. The refractive pattern layer PTL includes a first light transmitting layer that contains a high reflective index material and a second light transmitting layer that contains a low reflective index material.

According to an embodiment, the refractive pattern layer PTL refracts second light L2 that is incident at a predetermined angle or more so that the second light L2 can propagate toward the light blocking portion BA. That is, the refractive pattern layer PTL prevents the second light L2 incident at a predetermined angle or more from propagating to the light transmitting portion TA. Depending on a height and a refractive index ratio of the light transmitting layers in the refractive pattern layer PTL, the predetermined angle that prevents light propagation to the light transmitting portion TA can change. A detailed description of the refractive pattern layer PTL will be provided below with reference to FIG. 13.

According to an embodiment, the display panel 100 is disposed on the refractive pattern layer PTL. The display panel 100 includes a backplane BP, a first thin film transistor layer TFTL1, a light emitting element layer EML, a first thin film encapsulation layer TFEL1, and a touch sensor layer TSL.

According to an embodiment, the backplane BP is disposed on the refractive pattern layer PTL or optical pattern layer CML and supports the first thin film transistor layer TFTL1. For example, the backplane BP is made of an insulation material such as a polymer resin.

For example, according to an embodiment, the backplane BP is a flexible substrate that can bend, fold, roll, etc. When the backplane BP is flexible, it may be formed of a polyimide (PI), but embodiments are not limited thereto.

According to an embodiment, the first thin film transistor layer TFTL1 is disposed on the back plane BP. The first thin film transistor layer TFTL1 includes at least one thin film transistor that drives each of a plurality of sub-pixels SP.

According to an embodiment, at least one thin film transistor of the sub-pixel SP includes a semiconductor layer, a gate electrode, a drain electrode and a source electrode. In addition, the first thin film transistor layer TFTL1 further includes scan lines, data lines, power lines, scan control lines connected to at least one thin film transistor of the sub-pixel SP, and routing lines that connect pads and the data lines.

According to an embodiment, the light emitting element layer EML is disposed on the first thin film transistor layer TFTL1. The light emitting element layer EML includes a light emitting element connected to at least one thin film transistor of the first thin film transistor layer TFTL1.

According to an embodiment, the light emitting element includes a first electrode, a light emitting layer, and a second electrode. For example, the light emitting layer is an organic light emitting layer made of an organic material, but embodiments are not limited thereto. When the light emitting layer is an organic light emitting layer, the thin film transistor of the first thin film transistor layer TFTL1 applies a predetermined voltage to the first electrode of the light emitting element, and the second electrode of the light emitting element receives a common voltage, so that holes and electrons diffuse into the organic light emitting layer through a hole transport layer and an electron transport layer, respectively, and the holes and electrons may combine with each other in the organic light emitting layer to form excitons that decay and emit light.

According to an embodiment, the light emitting element layer EML includes a pixel definition layer that defines a plurality of sub-pixels SP. The light emitting layers 162 adjacent to each other are spaced apart from and insulated from each other by the pixel definition layer 170.

According to an embodiment, the first thin film encapsulation layer TFEL1 is disposed on the light emitting element layer EML and covers the first thin film transistor layer TFTL1 and the light emitting element layer EML.

According to an embodiment, the first thin film encapsulation layer TFEL1 prevents oxygen or moisture from penetrating into the light emitting element layer EML. To this end, the first thin film encapsulation layer TFEL1 includes at least one inorganic layer. For example, the first thin film encapsulation layer TFEL1 includes an inorganic layer that includes an inorganic material such as silicon nitride (SiNx), silicon oxy nitride (SiON), silicon oxide (SiOx), titanium oxide (TiOx), or aluminum oxide (AlOx), but embodiments are not limited thereto.

According to an embodiment, the first thin film encapsulation layer TFEL1 protects the light emitting element layer EML from foreign particles such as dust. To this end, the first thin film encapsulation layer TFEL1 includes at least one organic layer. For example, the first thin film encapsulation layer TFEL1 includes an organic layer such as an acrylic resin, epoxy resin, phenolic resin, polyamide resin, or polyimide resin, but embodiments are not limited thereto.

According to an embodiment, the touch sensor layer TSL is disposed on the first thin film encapsulation layer TFEL1. The touch sensor layer TSL is disposed directly on the first thin film encapsulation layer TFEL1, thus reducing a thickness of the display device 10 as compared to when a separate touch panel that includes the touch sensor layer TSL is attached to the first thin film encapsulation layer TFEL1.

According to an embodiment, the touch sensor layer TSL includes touch electrodes that sense a user's touch and touch electrode lines that connect pads and the touch electrodes. The touch electrodes of the touch sensor layer TSL are disposed in a touch sensing area that overlaps the display area DA of the display panel 100.

According to an embodiment, the cover window CW is disposed on the display panel 100. The cover window CW is disposed on the touch sensor layer TSL of the display panel 100. For example, the cover window CW is attached onto the touch sensor layer TSL by a transparent adhesive member. The cover window CW is directly contacted by the user's finger F.

According to an embodiment, fingerprint sensor layer FPSL is disposed on the underside of the first substrate SUB1. An upper surface (or a first surface) of the first substrate SUB1 faces the optical pattern layer CML, and a lower surface (or a second surface) of the first substrate SUB1 faces the fingerprint sensor layer FPSL.

According to an embodiment, a first or upper surface of the fingerprint sensor layer FPSL is attached to the second or lower surface of the first substrate SUB1 by an adhesive member OCA. The adhesive member OCA is an optical clear adhesive member, but embodiments are not limited thereto.

According to an embodiment, the fingerprint sensor layer FPSL includes a plurality of fingerprint sensors FPS shown in FIG. 1. Each of the plurality of fingerprint sensors FPS is an optical fingerprint sensor. For example, the plurality of fingerprint sensors FPS may be one of a photo diode, a CMOS image sensor, a CCD camera, a photo transistor, etc., but embodiments are not limited thereto.

According to an embodiment, the plurality of fingerprint sensors FPS can recognize a user's fingerprint by sensing light reflected by the valley FV between the ridges FR of the finger F.

For example, according to an embodiment, when the user's finger F contacts cover window CW, the first light L1 output from the light emitting element layer EML is reflected by the ridges FR and the valleys FV of the finger F, and then reflected second light L2 propagates through the refractive pattern layer PTL and the light transmitting portion TA of the optical pattern layer CML to reach the fingerprint sensor layer FPSL under the first substrate SUB1. The fingerprint sensors FPS of the fingerprint sensor layer FPSL recognize a pattern of the user's fingerprint by distinguishing the second light L2 reflected by the ridges FR of the finger F and the second light L2 reflected by the valleys FV of the finger F. Therefore, the light transmitting portion TA of the optical pattern layer CML provides a passage for the second light L2 reflected by the user's finger F.

According to an embodiment, in the display device 10, the finger recognition process can be simplified by disposing the fingerprint sensor layer FPSL under the display panel 100, and since the fingerprint sensor FPS is not disposed in the path, i.e., the upper surface of the light emitting element layer EML, where the first light L1 is output, resolution deterioration can be prevented.

According to an embodiment, the fingerprint sensor layer FPSL includes a second substrate SUB2, a buffer layer 410, a second thin film transistor layer TFTL2, a light receiving element layer PDL, and a second thin film encapsulation layer TFEL2.

According to an embodiment, the second substrate SUB2 is a base substrate and is formed of an insulation material such as a polymer resin. For example, the second substrate SUB2 is a flexible substrate that can bend, fold, roll, etc. When the second substrate SUB2 is flexible, it can be formed of polyimide (PI), but embodiments are not limited thereto.

According to an embodiment, the buffer layer 410 is disposed on the second substrate SUB2. The buffer layer 410 is made of an inorganic layer that can prevent penetration of air or moisture. For example, the buffer layer 410 can be formed of multiple layers in which inorganic layers that include inorganic materials such as silicon nitride (SiNx), silicon oxy nitride (SiON), silicon oxide (SiOx), titanium oxide (TiOx), or aluminum oxide (AlOx) are alternately stacked, but embodiments are not limited thereto. According to some exemplary embodiments, the buffer layer 410 is omitted.

According to an embodiment, the second thin film transistor layer TFTL2 is disposed on the second substrate SUB2 or the buffer layer 410. The lower surface of the second thin film transistor layer TFTL2 faces the upper surface of the buffer layer 410 or the second substrate SUB2.

According to an embodiment, the second thin film transistor layer TFTL2 includes at least one thin film transistor to drive each of a plurality of fingerprint sensors FPS. At least one thin film transistor of the fingerprint sensors FPS includes a semiconductor layer, a gate electrode, a drain electrode, and a source electrode. In addition, the second thin film transistor layer TFTL2 further includes scan lines, lead-out lines and common voltage lines connected to at least one thin film transistor of the fingerprint sensors FPS.

According to an embodiment, the light receiving element layer PDL is disposed on the second thin film transistor layer TFTL2. The lower surface of the light receiving element layer PDL faces the upper surface of the second thin film transistor layer TFTL2.

According to an embodiment, the light receiving element layer PDL includes a light receiving element connected to at least one thin film transistor of the second thin film transistor layer TFTL2. The light receiving element includes a first electrode, a light receiving layer and a second electrode. For example, the light receiving layer is an organic light receiving layer made of an organic material, but embodiments are not limited thereto. When the light receiving layer is an organic light receiving layer, the organic light receiving layer receives the second light L2 and combines holes and electrons, and converts energy of the second light L2 into an electrical signal formed between the first electrode and the second electrode.

According to an embodiment, the light receiving element layer PDL includes a sensor definition layer that defines the plurality of fingerprint sensors FPS. The first electrode and the light receiving layer of the light receiving element are spaced apart and insulated from each other by the sensor definition layer.

According to an embodiment, the second thin film encapsulation layer TFEL2 is disposed on the light receiving element layer PDL. The lower surface of the second thin film encapsulation layer TFEL2 faces the upper surface of the light receiving element layer PDL.

According to an embodiment, the second thin film encapsulation layer TFEL2 covers the upper surface of the light receiving element layer PDL and prevents oxygen or moisture from penetrating into the light receiving element layer PDL. For example, the second thin film encapsulation layer TFEL2 includes at least one inorganic layer. at least one inorganic layer contains an inorganic material such as silicon nitride (SiNx), silicon oxy nitride (SiON), silicon oxide (SiOx), titanium oxide (TiOx), or aluminum oxide (AlOx), but embodiments are not limited thereto.

According to an embodiment, the second thin film encapsulation layer TFEL2 protects the light receiving element layer POL from foreign particles such as dust. For example, the second thin film encapsulation layer TFEL2 includes at least one organic layer. The at least one organic layer includes an organic material such as an acrylic resin, epoxy resin, phenolic resin, polyamide resin, or polyimide resin, but embodiments are not limited thereto.

FIG. 2 illustrates a case where the second thin film encapsulation layer TFEL2 of the fingerprint sensor layer FPSL faces a third direction (or Z-axis direction) that is normal to a plane of the first and second directions, but embodiments are not limited thereto. For example, in other embodiments, the fingerprint sensor layer FPSL is disposed so that the second substrate SUB2 faces the third direction (or Z-axis direction).

Figure 3:
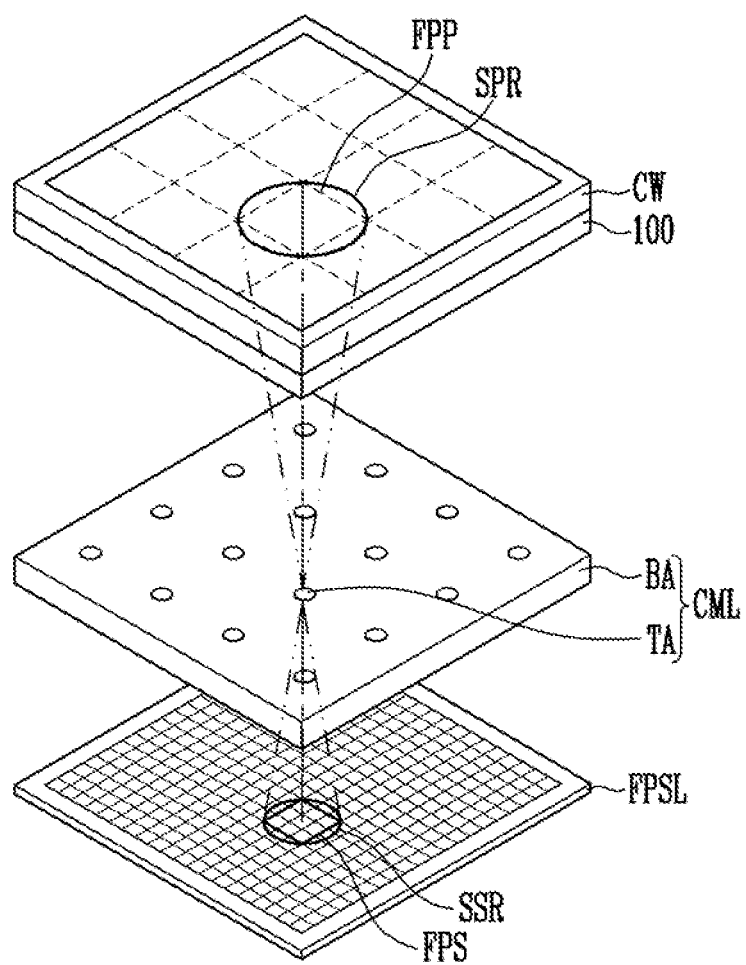
FIG. 3 is a perspective view of a path of reflected light in a display device according to an exemplary embodiment.
Figure 4:
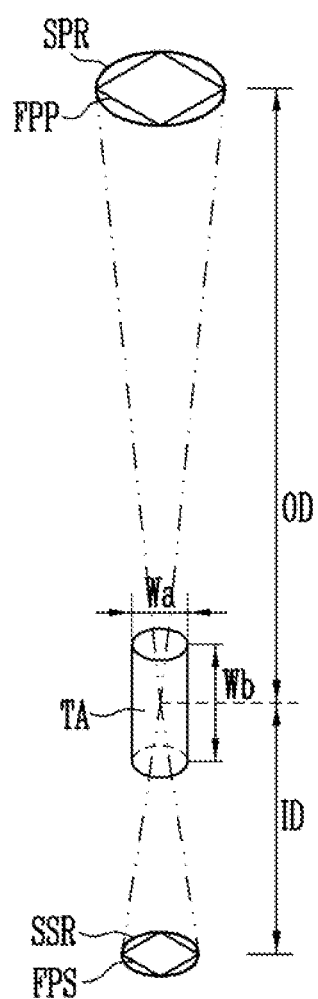
FIG. 4 illustrates a fingerprint pixel and a sensor pixel of a display device according to an exemplary embodiment.

FIG. 3 is a perspective view of a path of reflected light in a display device according to an exemplary embodiment. FIG. 4 illustrates a fingerprint pixel and a sensor pixel of a display device according to an exemplary embodiment.

Referring to FIGS. 3 and 4, according to an embodiment, the cover window CW includes a plurality of fingerprint pixels FPP and a sampling area SPR that surrounds each of the plurality of fingerprint pixels FPP. The fingerprint sensor layer FPSL includes a plurality of fingerprint sensors FPS and a sensing area SSR that surrounds each of the plurality of fingerprint sensors FPS.

According to an embodiment, one fingerprint pixel FPP on the cover window CW corresponds to at least one fingerprint sensor FPS of the fingerprint sensor layer FPSL. For example, in some embodiments, one fingerprint pixel FPP corresponds to twenty to thirty fingerprint sensor FPS, but embodiments are not limited thereto. The sampling area SPR on the cover window CW corresponds to the sensing area SSR of the fingerprint sensor layer FPSL.

According to an embodiment, each of the plurality of fingerprint pixel FPPs correspond to one light transmitting portion TA of the optical pattern layer CML. For example, when the user's finger F contacts the cover window CW, each of a plurality of sampling areas SPR reflects the first light L1 emitted from the display panel 100, and then the second light L2 is reflected from each of the plurality of sampling areas SPR and passes through the light transmitting portion TA of the optical pattern layer CML to reach the sensing area SSR of the fingerprint sensor layer FPSL.

According to an embodiment, the second light L2 reflected by the user's finger F passes through a plurality of light transmitting portions TA of the optical pattern layer CML. Therefore, a plurality of fingerprint sensor FPS can sense the second light L2 reflected by the ridges FR and valleys FV of the finger F that contacts the sampling area SPR on the cover window CW.

According to an embodiment, the display device 10 can adjust a ratio of a fingerprint distance OD and a sensor distance ID to sense light reflected by the user's finger F through the fingerprint sensor FPS. Here, the fingerprint distance OD corresponds to a distance between a surface of the cover window CW and a center point of the light transmitting portion TA of the optical pattern layer CML. The sensor distance ID corresponds to a distance between the center point of the light transmitting portion TA of the optical pattern layer CML and the fingerprint sensor FPS of the fingerprint sensor layer FPSL. For example, light reflected from one side of the fingerprint pixel FPP on the cover window CW passes through the center point of the light transmitting portion TA to reach the other side of the fingerprint sensor FPS. In addition, light reflected from the other side of the fingerprint pixel FPP on the cover window CW passes through the center point of the light transmitting portion TA to reach the one side of the fingerprint sensor FPS. Therefore, an image formed on the fingerprint sensor FPS is upside down and reversed from a shape of the fingerprint that directly contacts the fingerprint pixel FPP.

According to an embodiment, the light transmitting portion TA has a predetermined aspect ratio to distinguish the light reflected by the ridge FR of the user's finger F and the light reflected by the valley FV thereof, and the aspect ratio is provided to a separate fingerprint sensor FPS. According to an embodiment, the aspect ratio of the light transmitting portion TA is a value obtained by dividing a height Wb of the light transmitting portion TA by a line width Wa of the light transmitting portion TA. The line width Wa of the light transmitting portion TA is a width in the first direction (or X-axis direction) or the second direction (or Y-axis direction) of the light transmitting portion TA.

Figure 5:
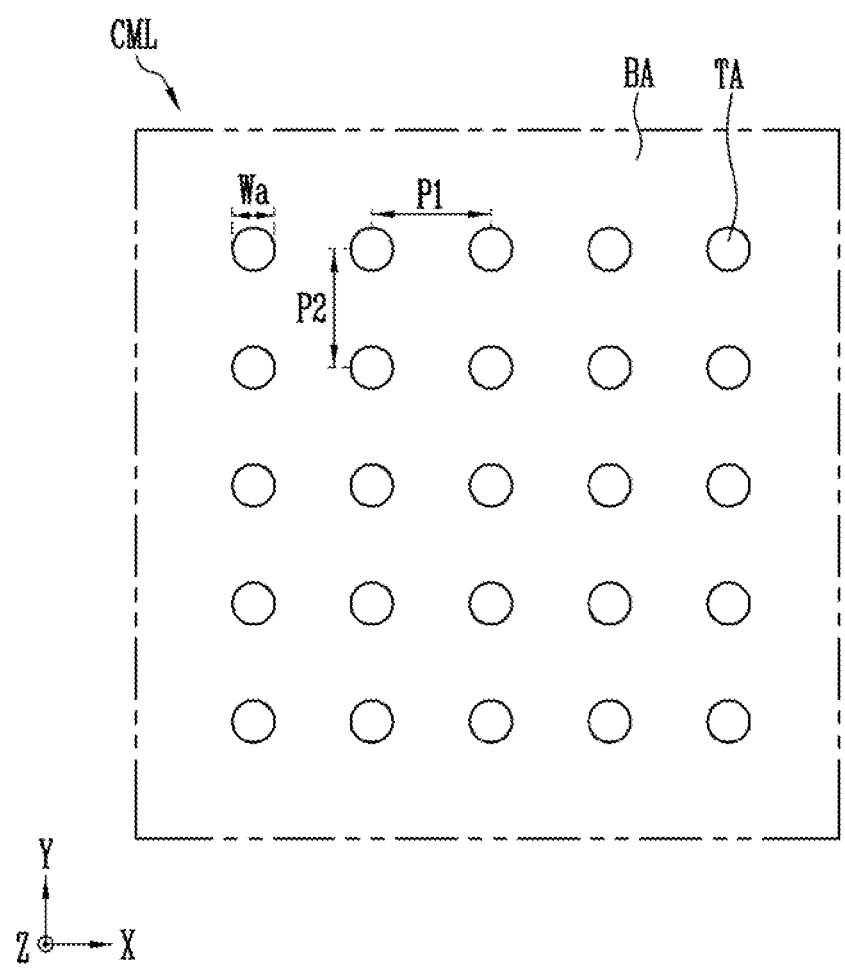
FIG. 5 is a top plan view of an example of an optical pattern layer of a display device according to an exemplary embodiment.

FIG. 5 is a top plan view of an example of an optical pattern layer of a display device according to an exemplary embodiment.

Referring to FIG. 5, according to an embodiment, the optical pattern layer CML includes a plurality of light transmitting portions TA. A planar shape of each the plurality of light transmitting portions TA is a circle. In this case, the line width Wa of each of a plurality of light transmitting portions TA is a diameter that ranges from 1 um to 10 um, but embodiments are not limited thereto.

According to an embodiment, the plurality of light transmitting portions TA are arranged with a first pitch P1 in the first direction (or X-axis direction). For example, the first pitch P1 is greater than or equal to 1.3 times the sensor distance ID, but embodiments are not limited thereto.

According to an embodiment, the plurality of light transmitting portions TA are arranged with a second pitch P2 in the second direction (or Y-axis direction). For example, in some embodiments, the second pitch P2 is substantially the same as the first pitch P1. In other embodiments, the second pitch P2 differs from the first pitch P1.

According to some embodiments, the plurality of light transmitting portions TA are arranged side by side in the first direction (or X-axis direction) and the second direction (or Y-axis direction). In other embodiments, the plurality of light transmitting portions TA are aligned in a direction other than the first direction (or X-axis direction) and the second direction (or Y-axis direction) while having the first pitch P1 and the second pitch P2.

For example, according to an embodiment, the first pitch P1 or the second pitch P2 are proportional to a thickness of the first thin film encapsulation layer TFEL1. When the thickness of the first thin film encapsulation layer TFEL1 increases, the fingerprint distance OD increases and an area of the fingerprint pixel FPP and sampling area SPR also increases. Therefore, the first pitch P1 or the second pitch P2 of the plurality of light transmitting portions TA is proportional to the thickness of the first thin film encapsulation layer TFEL1 to adjust the ratio of the fingerprint distance OD and the sensor distance ID.

For example, according to an embodiment, the first pitch P1 or the second pitch P2 is proportional to the distance between the light emitting elements of the light emitting element layer EML, or to the distance between the sub-pixels SP. As the distance between the light emitting elements increases, the distance between the second lights L2 reflected by the finger F also increases. Therefore, the first pitch P1 or the second pitch P2 are proportional to the distance between the light emitting elements or to the distance between the sub-pixels SP so that the second light L2 can pass through a plurality of light transmitting portions TA.

Figure 6:
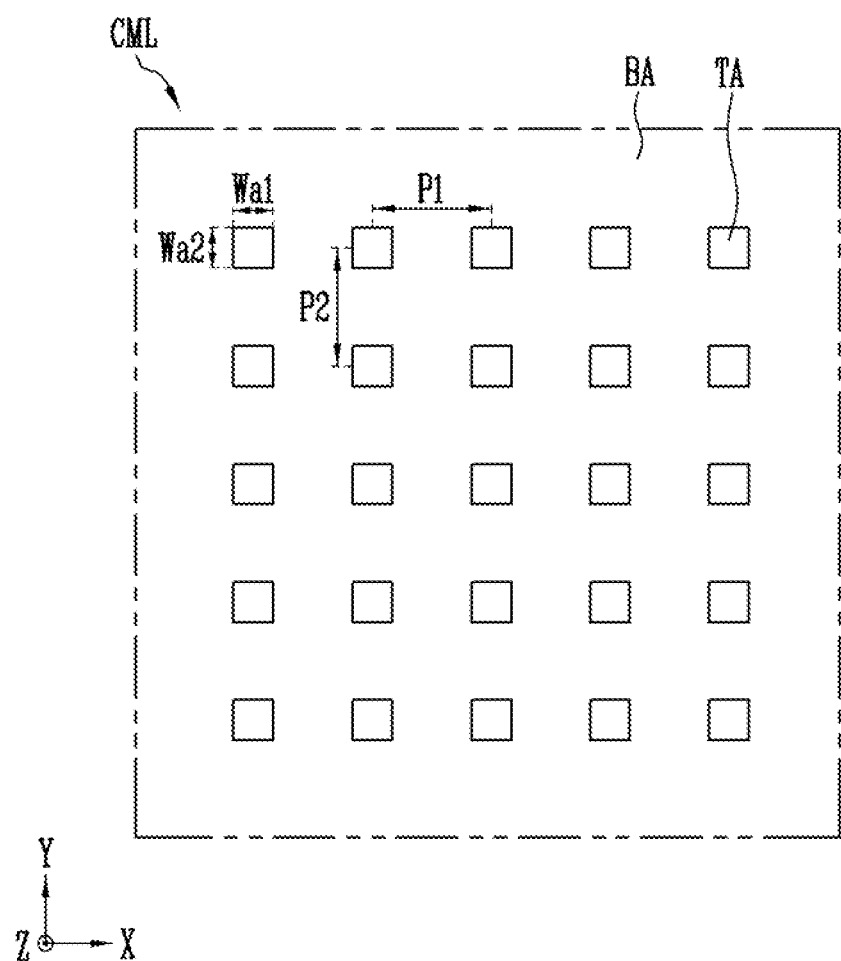
FIG. 6 is a top plan view of another example of an optical pattern layer of a display device according to an exemplary embodiment.

FIG. 6 is a top plan view of another example of an optical pattern layer of a display device according to an exemplary embodiment. The light transmitting portions TA of FIG. 6 have a shape that differs from the light transmitting portions TA of FIG. 5, and the same configurations as those described above will be briefly described or omitted.

Referring to FIG. 6, according to an embodiment, a planar shape of each of a plurality of light transmitting portions TA is a rectangle. Each of the plurality of light transmitting portions TA has a first length Wa1 in the first direction (or X-axis direction) and a second length Wa2 in the second direction (or Y-axis direction). For example, the first length Wa1 of each of the light transmitting portions TA ranges 1 um to 10 um, but embodiments are not limited thereto. For example, in some embodiments, the second length Wa2 of each of the light transmitting portions TA is the same as the first length Wa1. In other embodiments, the second length Wa2 of each of the light transmitting portions TA differs from the first length Wa1.

On the other hand, according to an embodiment, the shape of each of the plurality of light transmitting portion TA is not limited to the circular shape shown in FIG. 5 or the rectangular shape shown in FIG. 6. For example, the plurality of light transmitting portions TA may have various other shapes, such as an elliptic shape or a polygonal shape. In addition, each of the plurality of light transmitting portions TA can have different shapes from each other in the optical pattern layer CML.

According to an exemplary embodiment described above, the display device 10 improves sensitivity of the fingerprint sensor FPS by adjusting the ratio of the fingerprint distance OD and the sensor distance ID and adjusting the arrangement and shape of the light transmitting portion TA of the optical pattern layer CML.

Figure 7:
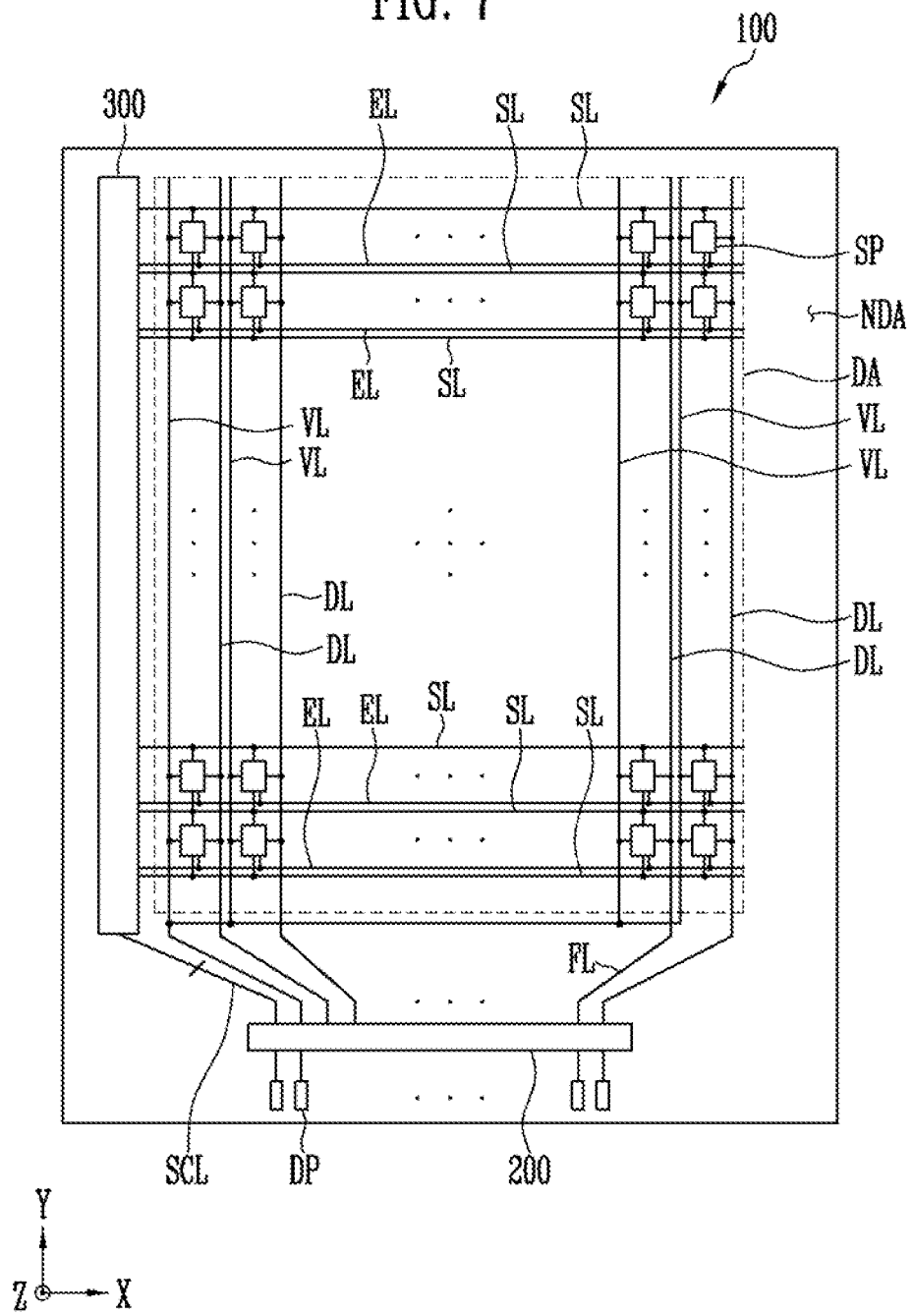
FIG. 7 illustrates a connection relationship between subpixels and lines of a display device according to an exemplary embodiment.

FIG. 7 illustrates a connection relationship between sub-pixels and lines of a display device according to an exemplary embodiment.

Referring to FIG. 7, according to an embodiment, the display panel 100 includes a display area DA and a non-display area NDA. The display area DA includes a plurality of sub-pixels SP, voltage supply lines VL connected to the sub-pixels SP, scan lines SL, light emission control lines EL, and data lines DL.

According to embodiments, each of the sub-pixels SP is connected to at least one scan line SL, at least one data line DL, at least one light emission control line EL and at least one voltage supply line VL. In FIG. 7, each of the sub-pixels SP are connected to two scan lines SL, one data line DL, one light emission control line EL, and one voltage supply line VL, but embodiments are not limited thereto. For example, in other embodiments, each of the sub-pixels SP is connected to three or more scan lines SL.

According to embodiments, each of the sub-pixels SP includes a driving transistor, at least one switching transistor, a light emitting element, and a capacitor.

According to embodiments, the driving transistor emits light by supplying a driving current to the light emitting element according to a data voltage applied to a gate electrode. For example, the driving transistor and at least one switching transistor are thin film transistors (TFT).

According to embodiments, the light emitting element emits light having a luminance according to a magnitude of the driving current of the driving transistor. For example, the light emitting element is an organic light emitting diode that includes a first electrode, an organic light emitting layer and a second electrode. The capacitor maintains the data voltage applied to the gate electrode of the driving transistor constant.

According to embodiments, the sub-pixels SP receive a driving voltage VDD through the voltage supply lines VL. Here, the driving voltage VDD is a high potential voltage that drives the light emitting element of the sub-pixels SP.

According to embodiments, a plurality of voltage supply lines VL are spaced apart from each other in the first direction (or X-axis direction), and extend in the second direction (or Y-axis direction). For example, each of a plurality of voltage supply lines VL is disposed between adjacent columns of sub-pixels SP disposed in the display area DA. Each of the plurality of voltage supply lines VL is connected to a sub-pixels SP disposed in the same column and supplies the driving voltage VDD to the sub-pixels SP.

According to embodiments, the scan lines SL and the light emission control lines EL extend in the first direction (or X-axis direction), and are spaced apart from each other in the second direction (or Y-axis direction). The scan lines SL and light emission control lines EL extend parallel with each other.

According to embodiments, the data lines DL are spaced apart from each other in the first direction (or X-axis direction) and may in the second direction (or Y-axis direction). The data lines DL extend parallel with the voltage supply line VL.

According to embodiments, the non-display area NDA includes a scan driver 300 that transmits the scan signals to the scan lines SL, a plurality of pan out lines FL that connect the data lines DL and a display driver 200, and a plurality of pads DP connected to a circuit board. The pads DP are disposed adjacent to one edge of the display panel 100.

According to embodiments, the display driver 200 is connected to the pads DP to receive digital video data and timing signals. The display driver 200 converts the digital video data into analog positive or negative data voltages and transmits the data voltages to the data lines through the fan out lines FL.

According to embodiments, the display driver 200 generates a scan control signal and transmits the scan control signal to the scan driver 300 through the scan control lines SCL.

According to embodiments, the scan driver 300 is disposed on one side of the non-display area NDA. The scan driver 300 includes a plurality of thin film transistors that generate scan signals in accordance with the scan control signal. The scan driver 300 transmits the scan signals to the sub-pixels SP as the scan control signal selects the sub-pixels SP to which the data voltages are transmitted.

Figure 8:
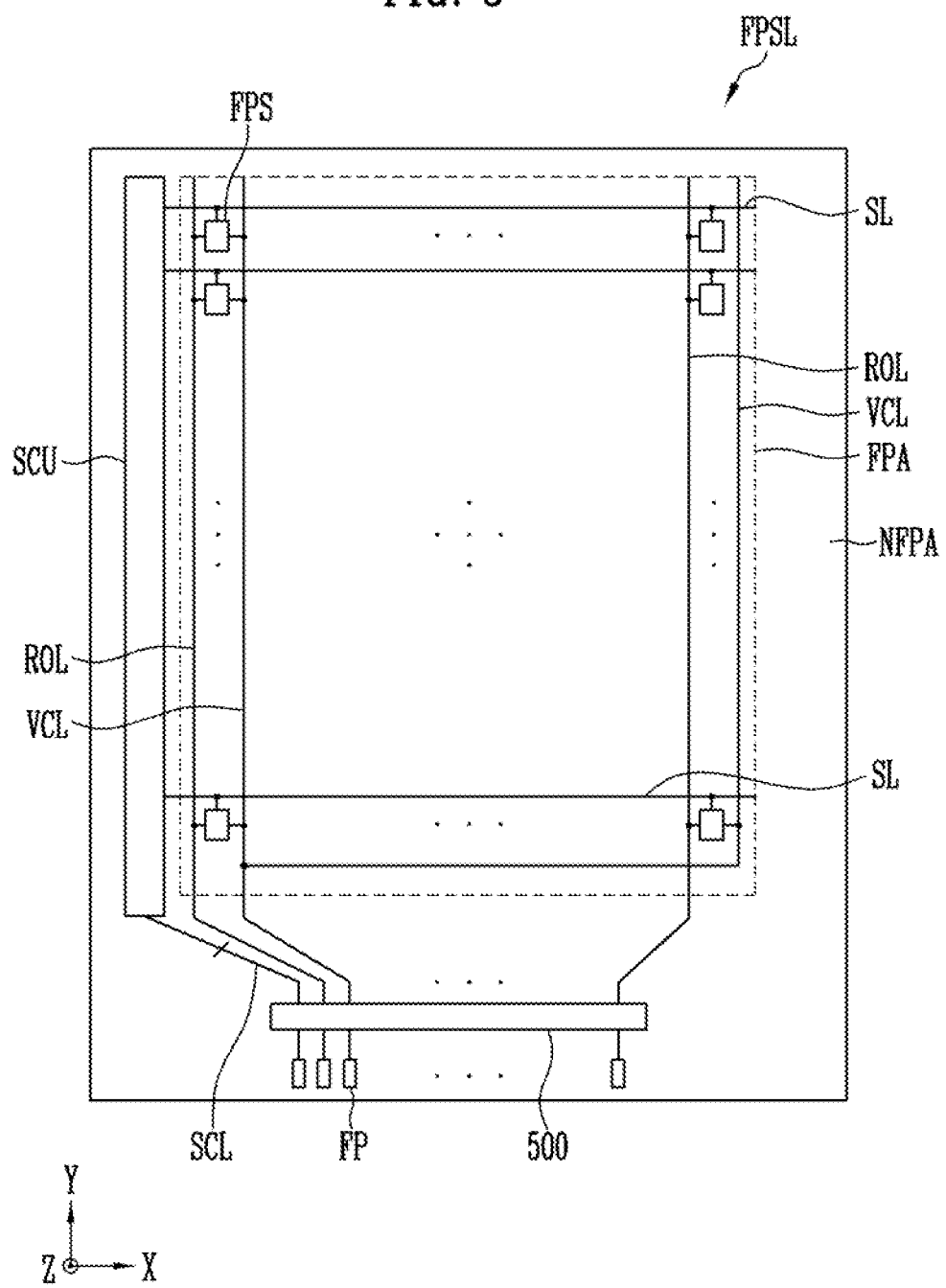
FIG. 8 illustrates a connection relationship between fingerprint sensors and lines of a display device according to an exemplary embodiment.
Figure 9:
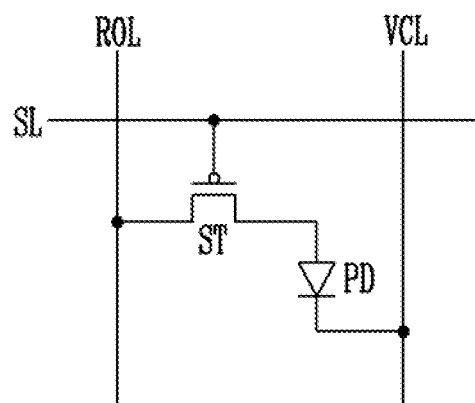
FIG. 9 is a circuit diagram of a switching transistor and a fingerprint sensor of a display device according to an exemplary embodiment.

FIG. 8 illustrates a connection relationship between fingerprint sensors and lines of a display device according to an exemplary embodiment. FIG. 9 is a circuit diagram of a switching transistor and a fingerprint sensor of a display device according to an exemplary embodiment.

Referring to FIGS. 8 and 9, according to embodiments, the fingerprint sensor layer FPSL includes a fingerprint recognition area FPA and a non-fingerprint recognition area NFPA. The fingerprint recognition area FPA includes a plurality of fingerprint sensor FPS, a plurality of scan lines SL, a plurality of lead out lines ROL, and a plurality of common voltage lines VCL connected to the fingerprint sensors FPS. A separation distance between a plurality of fingerprint sensor FPS ranges from 5 um to 50 um, and one fingerprint pixel on the cover window CW corresponds to twenty to thirty fingerprint sensors FPS of the fingerprint sensor layer FPSL, but embodiments are not limited thereto.

According to embodiments, each of the plurality of fingerprint sensors FPS is connected to a scan driver SCU through the scan lines SL and receives scan signals from the scan driver SCU through the scan lines SL. The scan lines SL extend in the first direction (or X-axis direction) and are spaced apart from each other in the second direction (or Y-axis direction). The scan driver SCU selects fingerprint sensors FPS to sense a change in a readout signal by transmitting a scan signal to each of the plurality of fingerprint sensors FPS.

According to embodiments, each of the plurality of fingerprint sensors FPS is connected to a sensor driver 500 through the lead out lines ROL and transmits read out signals to the sensor driver 500 through the lead out lines ROL. The lead out lines ROL are spaced apart from each other in the first direction (or X-axis direction) and extend in the second direction (or Y-axis direction).

According to embodiments, non-fingerprint recognition area NFPA is disposed outside the fingerprint recognition area FPA. The non-fingerprint recognition area NFPA is a remaining area of the fingerprint sensor layer FPSL except for the fingerprint recognition area FPA. The scan driver SCU is disposed on one side of the non-fingerprint recognition area NFPA and is connected to the scan lines SL that extend into the fingerprint recognition area FPA.

According to embodiments, the sensor driver 500 is disposed on one side of the non-fingerprint recognition area NFPA and connected to the lead-out line ROL that extend into the fingerprint recognition area FPA. The sensor driver 500 transmits a sensing driving voltage to the plurality of fingerprint sensor FPSs, and recognizes a pattern of a user's fingerprint by receiving a readout signal according to a touch of the users finger F.

For example, according to embodiments, when the user's finger F contacts the cover window CW, the readout signal of the fingerprint sensor FPS that receives the scan signal changes. The readout signal of the fingerprint sensor FPS that receives light reflected by the ridges FR of the finger F differs from the readout signal of the fingerprint sensor FPS that receives light reflected by the valleys FV of the finger F. The sensor driver 500 determines whether the ridges FR or the valleys FV of the finger F contact the fingerprint pixel of the cover window CW that correspond to the fingerprint sensor FPS by distinguishing between the readout signals. Therefore, the sensor driver 500 recognizes the pattern of the user's fingerprint based on the readout signal.

According to embodiments, the non-fingerprint recognition area NFPA further includes fingerprint recognition pads FP disposed at one edge of the fingerprint sensor layer FPSL. The fingerprint recognition pads FP are connected to the sensor driver 500 and transmit a signal received from an external integrated circuit to the sensor driver 500.

In FIG. 9, according to embodiments, the fingerprint sensor FPS includes a switching transistor ST and a light receiving element PD. The switching transistor ST transmits a sensing driving voltage to the light receiving element PD based on a scan signal transmitted to a gate electrode thereof. For example, the gate electrode of the switching transistor ST is connected to the scan line SL, the first electrode thereof is connected to the lead out line ROL, and the second electrode thereof is connected to the first electrode of the light receiving element PD. The first electrode of the switching transistor ST is a source electrode and the second electrode thereof is a drain electrode. When a source-gate voltage of the switching transistor ST exceeds a threshold voltage of the switching transistor ST, the driving current flows through a channel of the switching transistor ST.

According to embodiments, the light receiving element PD recognizes a pattern of a user's fingerprint based on the second light L2 reflected by the user's finger F. The first electrode of the light receiving element PD is connected to the second electrode of the switching transistor ST, and the second electrode thereof is connected to the common voltage line VCL. For example, a second electrode of a plurality of light receiving elements PD is a common electrode and connected to the common voltage line VCL. The common voltage line VCL transmits a low potential voltage to the second electrode of the light receiving element PD.

For example, according to embodiments, the light receiving element PD does not receive light when there is no user contact on the cover window CW. When not receiving light, the light receiving element PD outputs a driving current received from the first electrode to the second electrode.

According to embodiments, the light receiving element PD receives the second light L2 reflected by the ridges FR or the valleys FV of the finger F when a user's finger F contacts the cover window CW. The first light L1 emitted from the light emitting element layer EML is reflected by the ridges FR or valleys FV of the finger F, and the reflected second light L2 reaches the light receiving element PD of the fingerprint sensor layer FPSL. The light receiving element PD converts energy of the second light L2 into an electrical signal, such as a current or a voltage, formed between the first electrode and the second electrode, and the converted electrical signal is transmitted to the sensor driver 500 as a readout signal. For example, when a reverse bias is formed at the first electrode and the second electrode of the light receiving element PD, a current reverse to the driving current flows in proportion to a light intensity of the second light L2. Therefore, when the light receiving element PD receives the second light L2, the reverse current output from the light receiving element PD flows to the switching transistor ST and is transmitted to the sensor driver 500 as a readout signal.

According to embodiments, the sensor driver 500 recognizes the pattern of the user fingerprint by distinguishing whether the readout signal received from the fingerprint sensor FPS corresponds to the ridges FR or the valleys FV of the finger F.

According to embodiments, the light receiving element PD may be implemented as a photo transistor or a photo diode, but embodiments are not limited thereto. The light receiving element PD corresponds to an optical sensor that converts light energy into electrical energy, and uses a photovoltaic effect in which a current changes depending on light energy.

Figure 10:
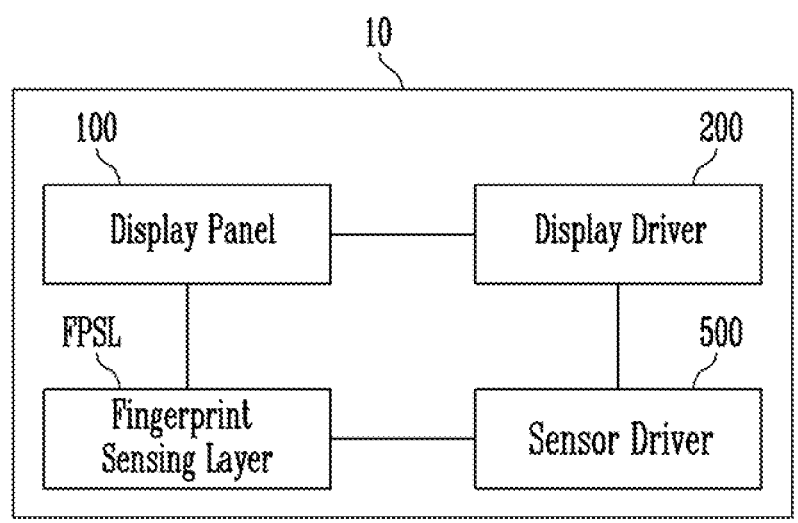
FIG. 10 is a block diagram of a display device according to an exemplary embodiment.

FIG. 10 is a block diagram of a display device according to an exemplary embodiment.

Referring to FIG. 10, according to embodiments, the display device 10 includes a display panel 100, a display driver 200, a fingerprint sensor layer FPSL and a sensor driver 500.

According to embodiments, the display driver 200 transmits an image driving signal to the display panel 100 to control an image display operation of the display panel 100. The display driver 200 generates an image driving signal based on digital video data and a timing signal received from an external host. For example, the display driver 200 receives digital video data and the timing signal from a host, and the timing signal includes a vertical synchronization signal, a horizontal synchronization signal, a clock signal, etc. In addition, the image driving signal includes a scan signal, a light emission control signal and a data signal.

According to embodiments, the sensor driver 500 recognizes the user's fingerprint by controlling the operation of a plurality of fingerprint sensors FPS of the fingerprint sensor layer FPSL. For example, the sensor driver 500 transmits a sensing driving voltage to a plurality of fingerprint sensors FPS and receives a readout signal due to a touch of a finger F. The fingerprint sensor FPS transmits different readout signals to the sensor driver 500 based on the energy of light reflected by each of the ridges FR and valleys FV of the finger F. The sensor driver 500 recognizes the user's fingerprint based on the readout signal that corresponds to each of a plurality of fingerprint pixels of the cover window CW.

Figure 11:
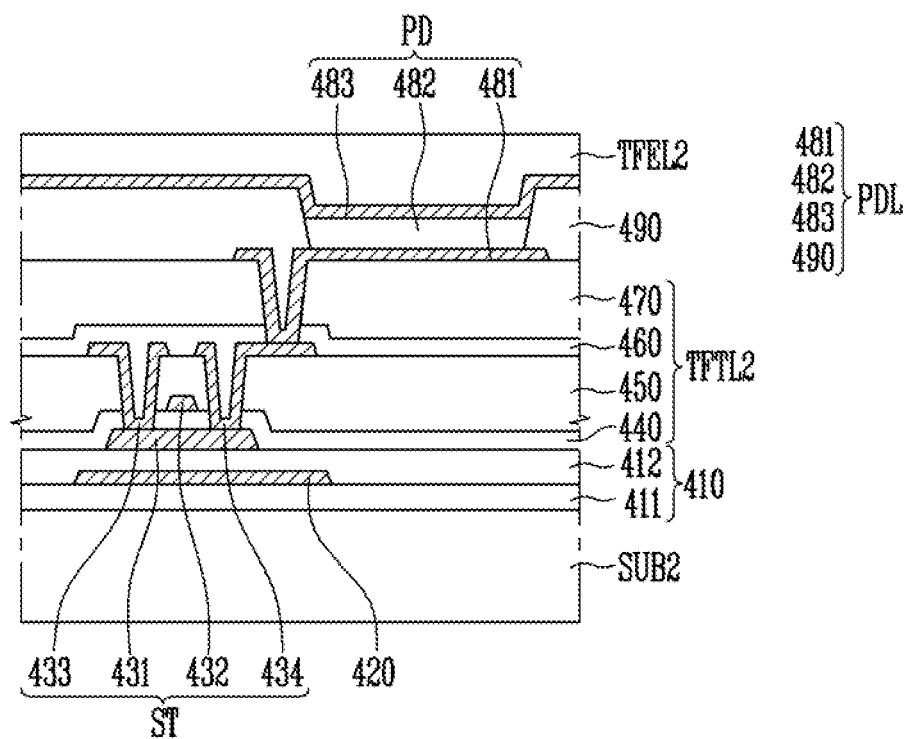
FIG. 11 is a cross-sectional view of a fingerprint sensor layer of a display device according to an exemplary embodiment.

FIG. 11 is a cross-sectional view of a fingerprint sensor layer of a display device according to an exemplary embodiment.

Referring to FIG. 11, according to embodiments, the fingerprint sensor layer FPSL includes a second substrate SUB2, a buffer layer 410, a second thin film transistor layer TFTL2, a light receiving element layer PDL and a second thin film encapsulation layer TFEL2.

According to embodiments, the second substrate SUB2 is a base substrate and is made from an insulation material such as a polymer resin. For example, the second substrate SUB2 is a flexible substrate that can bend, fold, roll, etc. When the second substrate SUB2 is flexible, it can be formed of polyimide (PI), but embodiments are not limited thereto.

According to embodiments, the buffer layer 410 includes a first buffer layer 411 and a second buffer layer 412. The first buffer layer 411 is disposed on the second substrate SUB2. The first buffer layer 411 is made of an inorganic layer that can prevent penetration of air or moisture. The first buffer layer 411 is formed of at least one inorganic layer and includes an inorganic material such as silicon nitride ($SiN_x$), silicon oxy nitride (SION), silicon oxide (SiOx), titanium oxide (TiOx), or aluminum oxide (AlOx), but embodiments are not limited thereto.

According to embodiments, a light blocking pattern 420 is disposed is disposed on the first buffer layer 411. For example, the light blocking pattern 420 is formed by depositing a light absorbing material or light blocking material on the first buffer layer 411 and then performing exposure patterning. The light blocking pattern 420 may be made of metals such as molybdenum (Mo), aluminum (Al), chromium (Cr), silver (Ag), and the like or alloys thereof, but is not limited thereto.

According to embodiments, the second buffer layer 412 is disposed on the first buffer layer 411 and covers the light blocking pattern 420 patterned on the first buffer layer 411. The second buffer layer 412 is made of an inorganic layer that can prevent penetration of air or moisture.

According to embodiments, the second thin film transistor layer TFTL2 is disposed on the second buffer layer 412. The second thin film transistor layer TFTL2 includes a switching transistor ST that drives each of a plurality of fingerprint sensors FPS. The switching transistor overlaps the light blocking pattern 420. The second thin film transistor layer TFTL2 further includes a gate insulation layer 440, an interlayer insulation layer 450, a protective layer 460, and a planarization layer 470. The switching transistor ST of the fingerprint sensor FPS includes a semiconductor layer 431, a gate electrode 432, a source electrode 433, and a drain electrode 434.

According to embodiments, the semiconductor layer 431 is disposed on the second buffer layer 412. The semiconductor layer 431 overlaps the gate electrode 432, the source electrode 433, and the drain electrode 434. The semiconductor layer 431 is in direct contact with the source electrode 433 and the drain electrode 434 and faces the gate electrode 432 with the gate insulation layer 440 disposed therebetween.

According to embodiments, the gate electrode 432 is disposed on the gate insulation layer 440. The gate electrode 432 overlaps the semiconductor layer 431 with the gate insulation layer 440 disposed therebetween.

According to embodiments, the source electrode 433 and drain electrode 434 are spaced apart from each other on the interlayer insulation layer 450. The source electrode 433 contacts one side of the semiconductor layer 431 through a first contact hole that penetrates the gate insulation layer 440 and the interlayer insulation layer 450. The drain electrode 434 contacts the other side of the semiconductor layer 431 through a second contact hole that penetrates the gate insulation layer 440 and the interlayer insulation layer 450. The drain electrode 434 is in direct contact with a first electrode 481 of the light receiving element PD through a third contact hole that penetrates the protective layer 460.

According to embodiments, the gate insulation layer 440 is disposed on the semiconductor layer 431. For example, the gate insulation layer 440 is disposed on the semiconductor layer 431 and the second buffer layer 412, and insulates the semiconductor layer 431 from the gate electrode 432. The gate insulation layer 440 includes a first contact hole through which the source electrode 433 extends and a second contact hole through which the drain electrode 434 extends.

According to embodiments, the interlayer insulation layer 450 is disposed on the gate electrode 432 and the gate insulation layer 440. The interlayer insulation layer 450 includes a first contact hole through which the source electrode 433 extends and a second contact hole through which the drain electrode 434 extends. Here, each of the first contact hole and the second contact hole of the interlayer insulation layer 450 is respectively connected to the first contact hole and the second contact hole of the gate insulation layer 440.

According to embodiments, the protective layer 460 is disposed on the switching transistor ST and protects the switching transistor ST. The protective layer 460 includes a third contact hole through which the first electrode 481 of the light receiving element PD extends.

According to embodiments, the planarization layer 470 is disposed on the protective layer 460 and planarizes the upper surface of the switching transistor ST. The planarization layer 470 includes a third contact hole through which the first electrode 481 of the light receiving element PD extends. The third contact hole of the protective layer 460 and the third contact hole of the planarization layer 470 are connected to each other so that the first electrode 481 of the light receiving element PD can extend therethrough.

According to embodiments, the light receiving element layer PDL is disposed on the second thin film transistor layer TFTL2. The light receiving element layer PDL includes a light receiving element PD connected to the switching transistor ST of the second thin film transistor layer TFTL2 and a sensor definition layer 490 that has an opening into which the light receiving element PD is disposed, and that surrounds the light receiving element PD.

According to embodiments, light receiving element PD includes the first electrode 481, a light receiving layer 482, and a second electrode 483.

According to embodiments, the first electrode 481 is disposed on the planarization layer 470. The first electrode 481 overlaps the opening of the sensor definition layer 490. In addition, the first electrode 481 contacts the drain electrode 434 of the switching transistor ST through the third contact hole that penetrates the planarization layer 470 and the protective layer 460. The first electrode 481 is made of a transparent conductive material that transmits the second light L2 reflected by the finger F, and serves as an anode of the light receiving element PD.

According to embodiments, the light receiving layer 482 is disposed on the first electrode 481. The light receiving layer 482 includes a hole injection layer, a hole transport layer, a light receiving layer, an electron blocking layer, an electron transport layer, an electron injection layer, etc. For example, the light receiving layer 482 is an organic light receiving layer made of organic material, but embodiments are not limited thereto. When the light receiving layer 482 is an organic light receiving layer, the organic light receiving layer receives the second light L2 to combine holes and electrons, and converts the energy of the second light L2 into an electrical signal, such as a current or a voltage, formed between the first electrode 481 and the second electrode 483.

According to embodiments, the second electrode 483 is disposed on the light receiving layer 482 and the sensor definition layer 490. For example, the second electrode 483 is implemented as an electrode common to the entire fingerprint sensor FPS without being divided for each fingerprint sensor FPS. When a driving voltage is applied to the first electrode 481 and a common voltage is applied to the second electrode 483, the holes and electrons move into the light receiving layer 482 and combine with each other. The second electrode 483 serves as a cathode of the light receiving element PD.

According to embodiments, the sensor definition layer 490 of the light receiving element layer PDL is disposed on the planarization layer 470. The sensor definition layer 490 is disposed between adjacent first electrodes 481 to partition a plurality of first electrodes 481 and electrically insulate adjacent first electrodes 481 and light receiving layers 482. The sensor definition layer 490 has an opening that at least partially exposes the first electrode 481 and into which the light receiving layer 482 is disposed.

According to embodiments, the second thin film encapsulation layer TFEL2 is disposed on the light receiving element layer PDL. The second thin film encapsulation layer TFEL2 covers the upper surface of the light receiving element layer PDL and prevents oxygen or moisture from penetrating into the light receiving element layer PDL. The second thin film encapsulation layer TFEL2 includes at least one inorganic layer. For example, the second thin film encapsulation layer TFEL2 includes an inorganic layer that contains an inorganic material such as silicon nitride (SiNx), silicon oxy nitride (SiON), silicon oxide (SiOx), titanium oxide (TiOx), or aluminum oxide (AlOx), but embodiments are not limited thereto.

According to embodiments, the second thin film encapsulation layer TFEL2 protects the light receiving element layer PDL from foreign particles such as dust. The second thin film encapsulation layer TFEL2 includes at least one organic layer. For example, the second thin film encapsulation layer TFEL2 includes an organic layer such as an acrylic resin, epoxy resin, phenolic resin, polyamide resin, or polyimide resin, but embodiments are not limited thereto.

Figure 12:
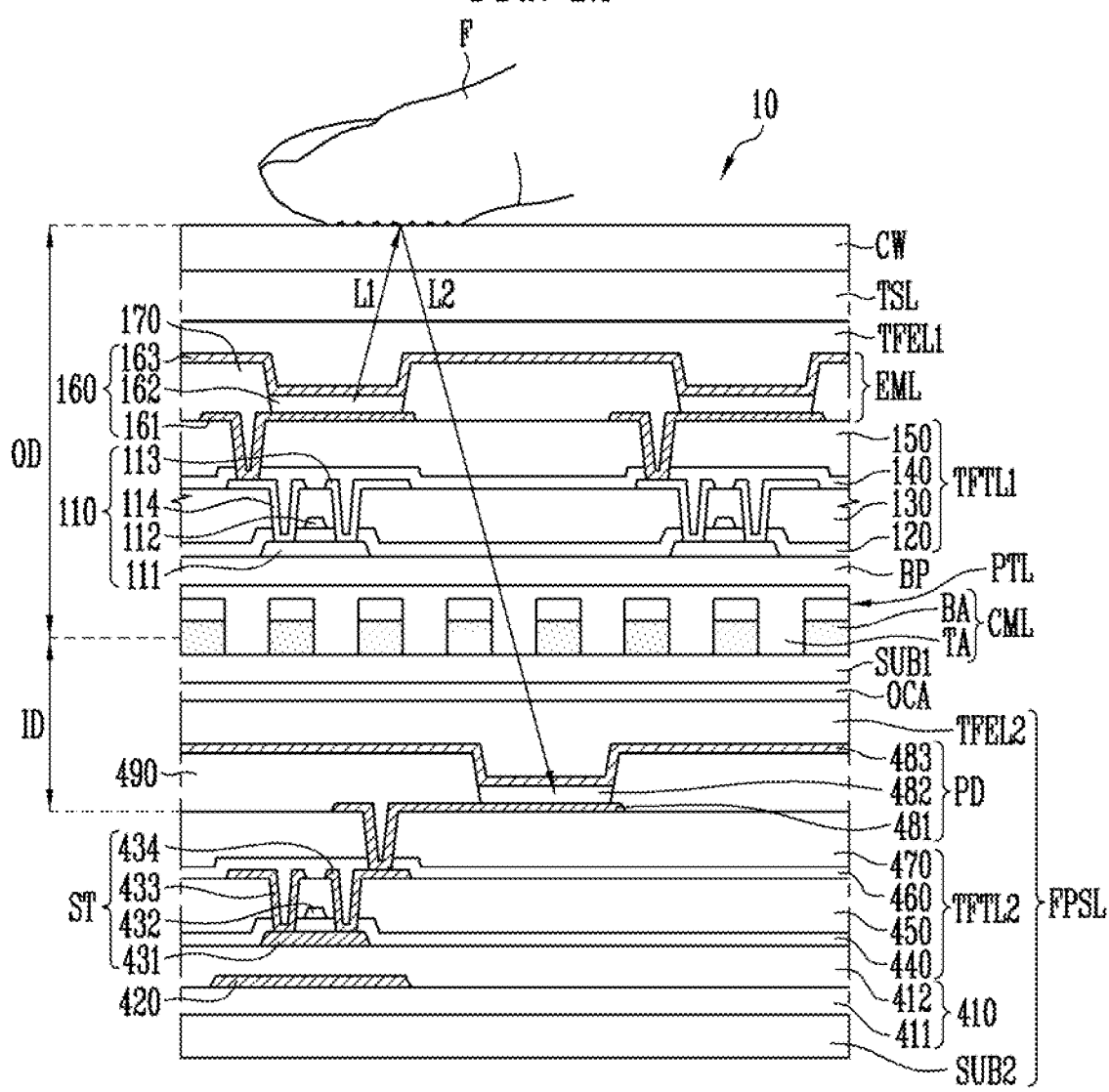
FIG. 12 is a cross-sectional view of a display device according to an exemplary embodiment.

FIG. 12 is a cross-sectional view of a display device according to an exemplary embodiment. FIG. 12 illustrates a portion of configurations of a display device of FIG. 2 in detail, and the same configurations as those described above will be briefly described or omitted.

Referring to FIGS. 2 and 12, according to embodiments, the display device 10 includes a first substrate SUB1, an optical pattern layer CML, a refractive pattern layer PTL, a display panel, a cover window CW, and a fingerprint sensor layer FPSL. The display panel 100 (see FIG. 2) includes a backplane BP, a first thin film transistor layer TFTL1, a light emitting element layer EML, a first thin film encapsulation layer TFEL1, and a touch sensor layer TSL. The touch sensor layer FPSL includes a second substrate SUB2, a buffer layer 410, a second thin film transistor layer TFTL2, a light receiving element layer PDL (see FIG. 2), and a second thin film encapsulation layer TFEL2.

According to embodiments, the optical pattern layer CML includes a plurality of light transmitting portions TA. The plurality of light transmitting portions TA provide optical passages for the second light L2, which is first light L1 emitted from the light emitting element layer EML that has been reflected by the user's body and which propagates to the fingerprint sensor layer FPSL.

According to embodiments, the refractive pattern layer PTL adjusts the path of the second light L2 by refracting at least a portion of the second light L2 propagating to the fingerprint sensor layer FPSL. The refractive pattern layer PTL includes a first light transmitting layer that includes a high reflective index material and a second light transmitting layer that includes a low reflective index material.

A detailed description of the optical pattern layer CML and the refractive pattern layer PTL will be provided below with reference to FIGS. 13 and 22 to 25.

According to embodiments, the first thin film transistor layer TFTL1 is disposed on the backplane BR The first thin film transistor layer TFTL1 includes at least one thin film transistor 110 that drives each of a plurality of sub-pixels SP.

According to embodiments, the first thin film transistor layer TFTL1 further includes a gate insulation layer 120, an interlayer insulation layer 130, a protective layer 140, and a planarization layer 150. The at least one thin film transistor 110 includes a semiconductor layer 111, a gate electrode 112, a source electrode 113, and a drain electrode 114.

According to embodiments, the semiconductor layer 111 is disposed on the backplane BP. The semiconductor layer 111 overlaps the gate electrode 112, the source electrode 113, and the drain electrode 114. The semiconductor layer 111 is in direct contact with the source electrode 113 and the drain electrode 114 and faces the gate electrode 112 with the gate insulation layer 120 interposed therebetween.

According to embodiments, the gate electrode 112 is disposed on the gate insulation layer 120. The gate electrode 112 overlaps the semiconductor layer 111 with the gate insulation layer 120 interposed therebetween.

According to embodiments, the source electrode 113 and drain electrode 114 are disposed spaced apart from each other on the interlayer insulation layer 130. The source electrode 113 contacts one side of the semiconductor layer 111 through a first contact hole that penetrates the gate insulation layer 120 and the interlayer insulation layer 130. The drain electrode 114 contacts the other side of the semiconductor layer 111 through a second contact hole that penetrates the gate insulation layer 120 and the interlayer insulation layer 130. The drain electrode 114 is in direct contact with a first electrode 161 of a light emitting element 160 through a third contact hole that penetrates the protective layer 140 and the planarization layer 150.

According to embodiments, the gate insulation layer 120 is disposed on the semiconductor layer 111 and the backplane BP, and insulates the semiconductor layer 111 from the gate electrode 112. The gate insulation layer 120 includes a first contact hole through which the source electrode 113 extends and a second contact hole through which the drain electrode 114 extends.

According to embodiments, the interlayer insulation layer 130 is disposed on the gate electrode 112 and the gate insulation layer 120. The interlayer insulation layer 130 includes a first contact hole through which the source electrode 113 extends and a second contact hole through which the drain electrode 114 extends. Here, the first and second contact holes of the interlayer insulation layer 130 are respectively connected to the first and second contact holes of the gate insulation layer 120.

According to embodiments, the protective layer 140 is disposed on the thin film transistor 110 and the interlayer insulation layer 130 and protects the thin film transistor 110. The protective layer 140 includes a third contact hole through which the first electrode 161 of the light emitting element 160 extends.

According to embodiments, the planarization layer 150 is disposed on the protective layer 140 and planarizes the upper surface of the thin film transistor 110. The planarization layer 150 includes a third contact hole through which the first electrode 161 of the light emitting element 160 extends. Here, the third contact hole of the protective layer 140 and the third contact hole of the planarization layer 150 are connected to each so that the first electrode 161 of the light emitting element 160 can extend therethrough.

According to embodiments, the light emitting element layer EML is disposed on the first thin film transistor layer TFTL1. The light emitting element layer EML includes a light emitting element 160 connected to the thin film transistor 110 of the first thin film transistor layer TFTL1, and a pixel definition layer 170 that has an opening into which the light emitting element 160 is disposed, and that surrounds the light emitting element 160.

According to embodiments, the light emitting element 160 includes the first electrode 161, a light emitting layer 162, and a second electrode 163.

According to embodiments, the first electrode 161 is disposed on the planarization layer 150. The first electrode 161 overlaps the opening of the pixel definition layer 170. The first electrode 161 is in contact with the drain electrode 114 of the thin film transistor 110 through the third contact hole that penetrates the planarization layer 150 and the protective layer 140. The first electrode 161 serves as an anode of the light emitting element 160.

According to embodiments, the light emitting layer 162 is disposed on the first electrode 161. The light emitting layer 162 includes a hole injection layer, a hole transport layer, a light emitting layer, an electron blocking layer, an electron transport layer, an electron injection layer, etc. For example, the light emitting layer 162 is an organic light emitting layer made of an organic material, but embodiments are not limited thereto. When the light emitting layer 162 is an organic light emitting layer, the thin film transistor 110 of the first thin film transistor layer TFTL1 applies a voltage to the first electrode 161 of the light emitting element 160, and the second electrode 163 of the light emitting element 160 receives a common voltage, and thus holes and electrons move into the organic light emitting layer 162 through a hole transport layer and an electron transport layer, respectively, and the holes and electrons combine with each other in the organic light emitting layer 162 to form excitons, which emit light when they decay back to a ground state.

According to embodiments, the second electrode 163 is disposed on the light emitting layer 162 and the pixel definition layer 170. The second electrode 163 is implemented as an electrode common to the entire sub-pixel SP without being divided for each sub-pixel SP.

According to embodiments, the pixel definition layer 170 defines the plurality of sub-pixels SP. The first electrode 161 and the light emitting layer 162 of the light emitting element 160 are spaced apart from and insulated from each other by the pixel definition layer 170.

In addition, since the first thin film encapsulation layer TFEL1, the touch sensor layer TSL, the cover window CW, and the fingerprint sensor layer FPSL have been described with reference to FIGS. 2 and 11, redundant descriptions thereof will be omitted.

Figure 13:
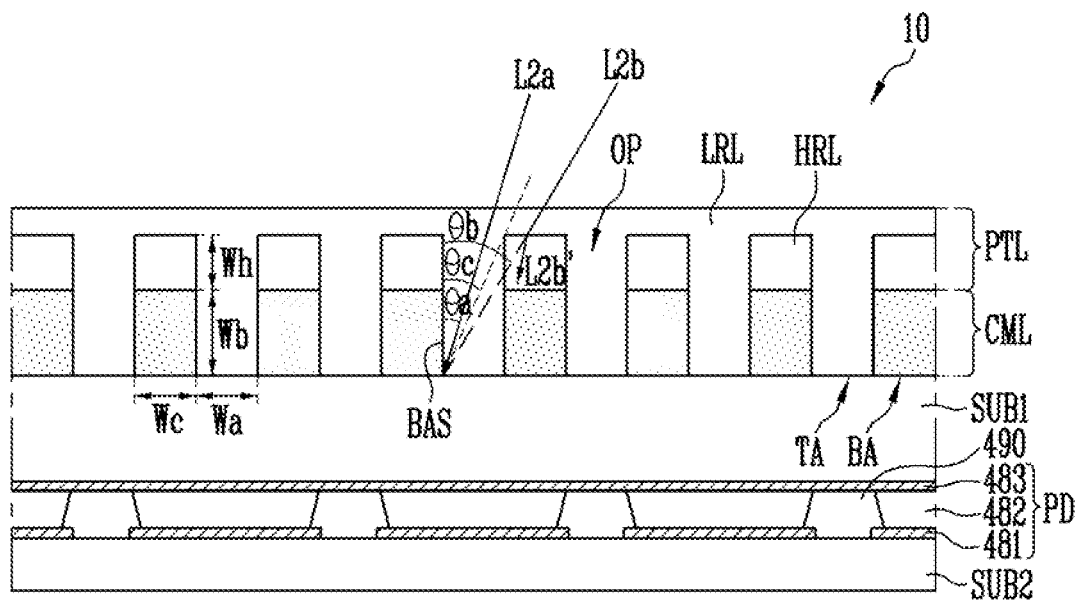
FIG. 13 is a cross-sectional view of an optical pattern layer and a refractive pattern layer of a display device according to an exemplary embodiment.
Figure 14:
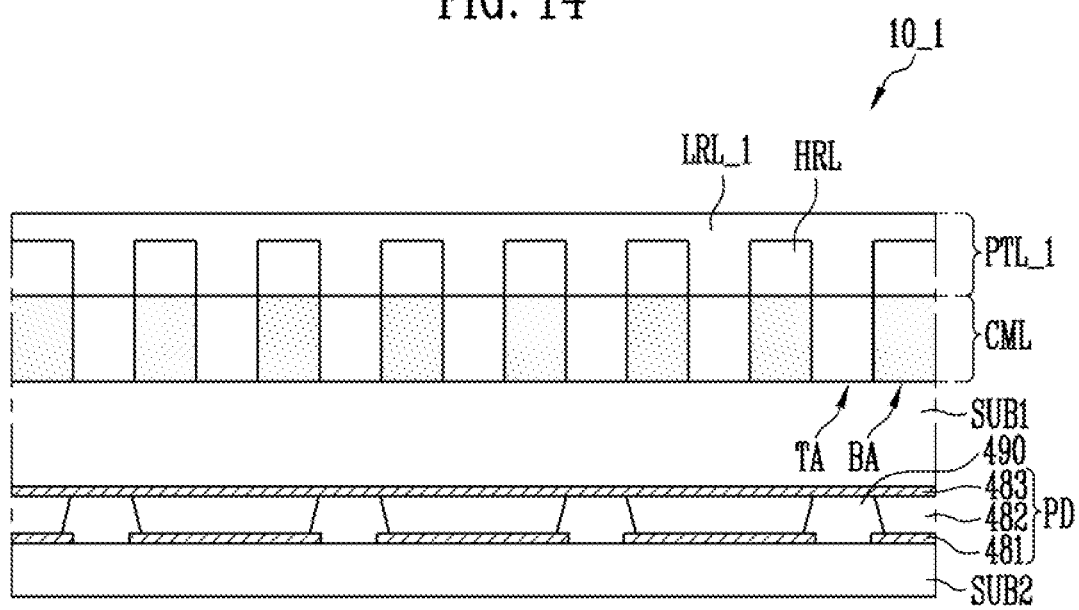
FIG. 14 illustrates a modified embodiment of a structure shown in FIG. 13.

FIG. 13 is a cross-sectional view of an optical pattern layer and a refractive pattern layer of a display device according to an exemplary embodiment. FIG. 14 is a modified embodiment of a structure shown in FIG. 13. Hereinafter, for a better understanding and ease of description, only a plurality of light receiving elements PD, the sensor definition layer 490 and the second substrate SUB2 of the fingerprint sensor layer FPSL are briefly illustrated, but embodiments are not limited thereto, and other embodiments include other configurations for forming the fingerprint sensor layer FPSL.

Referring to FIG. 13, according to embodiments, the optical pattern layer CML and the refractive pattern layer PTL are disposed on the first substrate SUB1.

As described above, according to embodiments, the optical pattern layer CML includes the light blocking portion BA and a plurality of light transmitting portions TA that pass through the light blocking portion BA in a thickness direction. The plurality of light transmitting portions TA may be holes in the light blocking portion BA. Some of the light incident on the optical pattern layer CML propagates through the light transmitting portions TA to the light receiving element PD, but the remaining light is blocked by the light blocking portion BA.

Specifically, according to embodiments, the optical pattern layer CML includes the light blocking portion BA and the light transmitting portion TA, and only light incident at an angle within a predetermined angle propagates therethrough with the remaining light being blocked. Here, the predetermined angle of the optical pattern layer CML is referred to as a cutoff angle θc or a blocking angle. The light receiving elements PD can distinguish light reflected by the ridges of the user's finger and light reflected by the valleys by the optical pattern layer CML.

According to embodiments, the cutoff angle θc of the optical pattern layer CML is determined by a ratio of a line width Wa and a height Wb of the light transmitting portion TA, that is, an aspect ratio of the light transmitting portion TA. In addition, a sum of the line width Wa of the light transmitting portion TA and a width Wc of the light blocking portion BA is constant. That is, a distance between the light transmitting portions TA is constant, but embodiments are not limited thereto.

According to embodiments, the refractive pattern layer PTL is disposed on the optical pattern layer CML. The refractive pattern layer PTL includes a first light transmitting layer HRL and a second light transmitting layer LRL that have different refractive indices.

Specifically, according to embodiments, the refractive index of the first light transmitting layer HRL is greater than the refractive index of the second light transmitting layer LRL. In an exemplary embodiment, a ratio of the refractive index of the first light transmitting layer HRL and that of the second light transmitting layer LRL is 0.9775 or less. Here, the ratio of the refractive indices is obtained by dividing the refractive index of the second light transmitting layer LRL by the refractive index of the first light transmitting layer HRL.

According to embodiments, the first light transmitting layer HRL is disposed on and overlaps the light blocking portion BA of the optical pattern layer CML. According to an exemplary embodiment, the first light transmitting layer HRL completely overlaps the light blocking portion BA, in which case a planar shape of the first light transmitting layer HRL is substantially the same as a planar shape of the light blocking portion BA.

According to embodiments, the first light transmitting layer HRL includes a plurality of openings OP. The openings OP in the first light transmitting layer HRL are formed at positions that correspond to the light transmitting portions TA of the optical pattern layer CML.

According to embodiments, the first light transmitting layer HRL is a high reflective index layer that includes a high reflective index material. For example, the first light transmitting layer HRL is an inorganic layer that includes inorganic materials such as silicon nitride (SiNx), silicon oxy nitride (SION), silicon oxide (SiOx), titanium oxide (TiOx), or aluminum oxide (AlOx), but embodiments are not limited thereto, and in other embodiments is an organic layer that includes inorganic particles made of the inorganic material.

According to embodiments, the second light transmitting layer LRL is formed on the first light transmitting layer HRL, and fills the light transmitting portion TA of the optical pattern layer CML. That is, the second light transmitting layer LRL fills in the spaces between the light blocking portions BA of the optical pattern layer CML. In addition, the second light transmitting layer LRL covers the first light transmitting layer HRL as a whole. The second light transmitting layer LRL fills the openings OP of the first light transmitting layer HRL.

According to embodiments, the upper surface of the second light transmitting layer LRL is generally flat. That is, the second light transmitting layer LRL serves as a planarization layer that compensates for steps in the configurations disposed thereunder. Therefore, light incident on the upper surface of the second light transmitting layer LRL can uniformly propagate to the optical pattern layer CML.

According to embodiments, the second light transmitting layer LRL is a low reflective index layer that includes a low reflective index material. As described above, the refractive index of the second light transmitting layer LRL is less than the refractive index of the first light transmitting layer HRL. For example, the second light transmitting layer LRL is an organic layer that includes a transparent organic material such as polyacrylates resin, epoxy resin, phenolic resin, polyamides resin, polyimide resin, unsaturated polyesters resin, polyphenylenethers resin, polyphenylenesulfides resin, or benzocyclobutene (BCB).

According to embodiments, a position and shape of the second light transmitting layer LRL is not limited to those disclosed above. For example, in some embodiments, as shown in FIG. 14, the second light transmitting layer LRL_1 does not fill the light transmitting portion TA. In this case, the material filling the light transmitting portion TA differs from the material that forms the second light transmitting layer LRL_1. For example, the light transmitting portion TA is filled with a transparent organic material that has a different refractive index from that of the second light transmitting layer LLR_1. For another example, at least a portion of an air layer is formed in the light transmitting portion TA.

In an exemplary embodiment described above, the cutoff angle θc of the optical pattern layer CML is determined by the aspect ratio of the light transmitting portion TA. As the line width Wa of the light transmitting portion TA decreases and the height Wb of the light transmitting portion TA increases, the aspect ratio of the light transmitting portion TA increases, and the cutoff angle θc of the optical pattern layer CML decreases. Accordingly, of the light propagating to the light receiving elements PD, the optical pattern layer CML further distinguishes light reflected by the finger's ridges from light reflected by the finger's valleys. That is, the fingerprint detection capability of the display device 10 is improved.

However, according to embodiments, as the aspect ratio of the light transmitting portion TA increases, the light blocked by the light blocking portion BA of the optical pattern layer CML increases, and the light transmittance of the optical pattern layer CML decreases. When the light transmittance of the optical pattern layer CML decreases, an insufficient amount of light reaches the light receiving element PD, and a signal to noise ratio (SNR) of the optical pattern layer CML deteriorates.

Accordingly, the display device 10 according to an exemplary embodiment of the present disclosure includes a refractive pattern layer PTL disposed on an optical pattern layer CML.

According to an embodiment, a first reflective light L2a and a second reflective light L2b are incident on the refractive pattern layer PTL. The first reflective light L2a is light incident at a first angle θa with respect to one side BAS of the light blocking portion BA. Here, the first reflective light L2a is incident at an angle within the cutoff angle θc, but the first reflective light L2a is not refracted by the refractive pattern layer PTL or first light transmitting layer HRL. The first reflective light L2a penetrates the refractive pattern layer PTL and the optical pattern layer CML and is incident on the light receiving element PD disposed thereunder.

On the other hand, according to an embodiment, the second reflective light L2b is incident at a second angle θb with respect to one side BAS of the light blocking portion BA. Here, the second reflective light L2b is incident at an angle greater than or equal to the cutoff angle θc. As described above, the refractive index of the first light transmitting layer HRL is greater than the refractive index of the second light transmitting layer LRL. Accordingly, the second reflective light L2b propagating from the second light transmitting layer LRL to the first light transmitting layer HRL is refracted. Therefore, the second reflective light L2b is refracted to the light blocking portion BA as refracted light L2b', and the refracted light L2b' is blocked or absorbed by the light blocking portion BA, and thus does not propagate to the light receiving element PD.

That is, according to an embodiment, the refractive pattern layer PTL refracts incident light incident due to a difference of the refractive indices of the first light transmitting layer HRL and the second light transmitting layer LRL, and thus the cutoff angle θc of the optical pattern layer CML can be adjusted.

In an exemplary embodiment of the present disclosure, when the refractive pattern layer PTL is disposed on the optical pattern layer CML, even if the line width Wa of the light transmitting portion TA is increased to improve the light transmittance of the optical pattern layer CML, the cutoff angle θc of the pattern layer CML can be maintained at a predetermined value. For example, as the line width Wa of the light transmitting portion TA is increased, the height Wh of the first light transmitting layer HRL is also increased. That is, the light transmittance of the optical pattern layer CML can be improved by increasing the line width Wa of the light transmitting portion TA, and the cutoff angle θc of the optical pattern layer CML can be maintained at a required value by adjusting the height Wh of the first light transmitting layer HRL.

According to an embodiment, when the line width Wa of the light transmitting portion TA is increased to improve the transmittance of the optical pattern layer CML, the signal to noise ratio (SNR) of the light receiving element PD of the fingerprint sensor is improved, and the fingerprint detection capability of the display device 10 is improved.

In addition, according to an embodiment, since the cutoff angle θc of the optical pattern layer CML can be maintained by adjusting the height Wh of the first light transmitting layer HRL, the optical pattern layer CML divides the light reflected by the finger's ridges from the light reflected by the finger's valleys. That is, the fingerprint detection capability of the display device 10 is improved.

Hereinafter, another exemplary embodiment will be described. The same components as those described above will be referred to by the same or similar reference numerals in exemplary embodiments below, and redundant descriptions thereof will be omitted or simplified.

Figure 15:
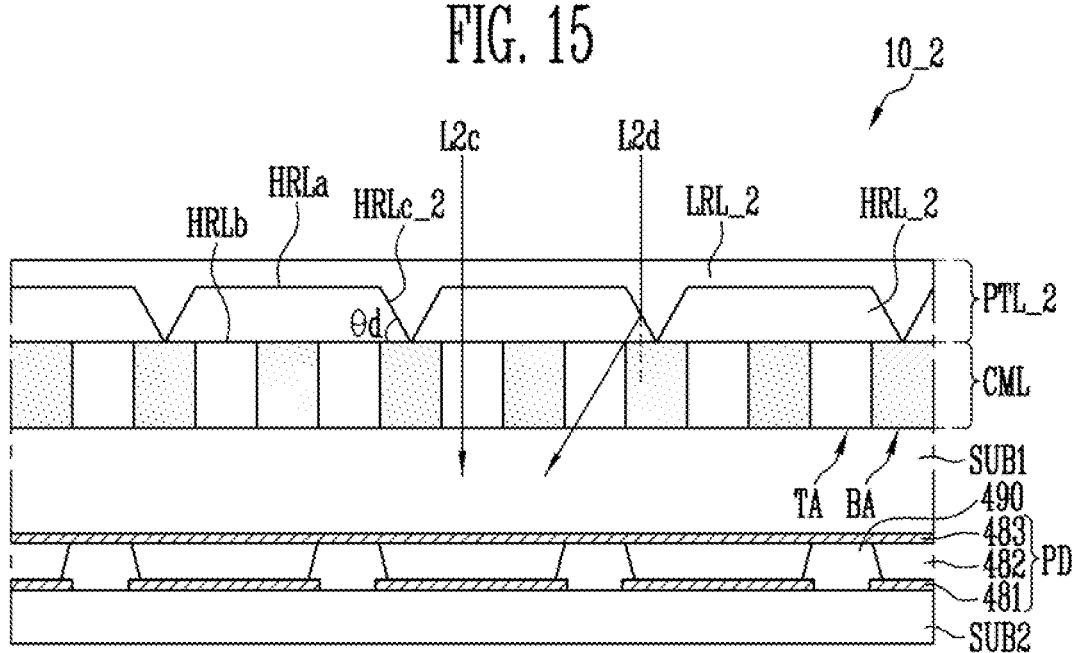
FIG. 15 is a cross-sectional view of an optical pattern layer and a refractive pattern layer of a display device according to another exemplary embodiment.
Figure 16:
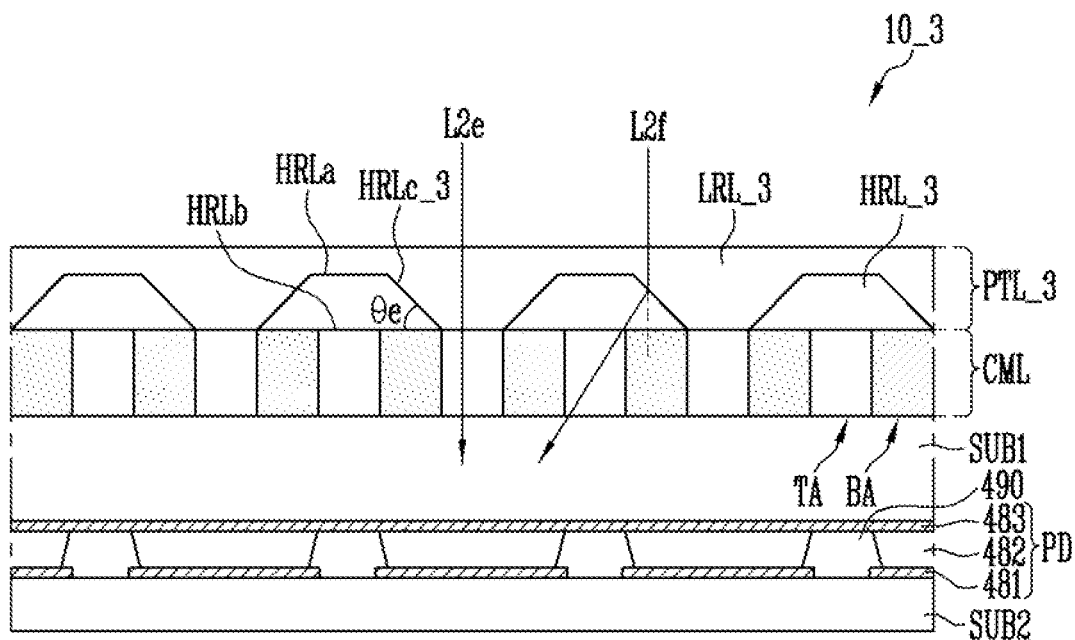
FIG. 16 illustrates a modified embodiment of a structure shown in FIG. 15.

FIG. 15 is a cross-sectional view of an optical pattern layer and a refractive pattern layer of a display device according to another exemplary embodiment. FIG. 16 is a modified embodiment of a structure shown in FIG. 15.

Referring to FIGS. 15 and 16, according to an embodiment, the display device 10_2 includes a refractive pattern layer PTL_2 disposed on the optical pattern layer CML. The refractive pattern layer PTL_2 is a lens pattern layer that controls a path of light reflected by an external object.

According to an embodiment, the refractive pattern layer PTL_2 includes a first light transmitting or lens layer HRL_2 and a second light transmitting or protective layer LRL_2.

According to an embodiment, the first light transmitting layer HRL_2 includes an upper surface HRLa, a lower surface HRLb opposite the upper surface HRLa, and an inclined surface HRLc_2 disposed between the upper surface HRLa and the lower surface HRLb that connects the upper surface HRLa to the lower surface HRLb. The upper surface HRLa and the lower surface HRLb are substantially parallel, and the lower surface HRLb directly contacts the optical pattern layer CML. However, embodiments of the present disclosure are not limited thereto, and in other embodiments, a separate support member that supports the refractive pattern layer PTL_2 is further disposed between the first light transmitting layer HRL_2 and the optical pattern layer CML.

According to an embodiment, the upper surface HRLa of the first light transmitting layer HRL_2 is smaller in area than the lower surface HRLb. The inclined surface HRLc_2 of the first light transmitting layer HRL_2 forms an inclination angle $9d$ with the lower surface HRLb, and the inclination angle $\theta d$ is an acute angle. At least a portion of the inclined surface HRLc_2 and the lower surface HRLb overlap the light blocking portion BA.

According to an embodiment, the second light transmitting layer LRL_2 is disposed on and covers the first light transmitting layer HRL_2. The upper surface of the second light transmitting layer LRL_2 is generally flat. That is, the second light transmitting layer LRL_2 serves as a planarization layer.

According to an embodiment, the refractive indices of the first light transmitting layer HRL_2 and the second light transmitting layer LRL_2 differ from each other. Specifically, the refractive index of the first light transmitting layer HRL_2 is greater than the refractive index of the second light transmitting layer LRL_2. Accordingly, light propagating from the second light transmitting layer LRL_2 to the first light transmitting layer HRL_2 is refracted.

According to an embodiment, the refractive pattern layer PTL_2 can improve the light transmittance of the optical pattern layer CML. For example, a first reflective light $L2c$ and a second reflective light $L2d$ can be incident on the refractive pattern layer PTL_2. The first reflective light $L2c$ passes through the upper surface HRLa and the lower surface HRLb of the first light transmitting layer HRL_2, and is incident on the light receiving element PD through the light transmitting portion TA.

On the other hand, according to an embodiment, the second reflective light $L2d$ is incident on the inclined surface HRLc_2 of the first light transmitting layer HRL_2. In this case, the second reflective light $L2d$ is initially propagating toward the light blocking portion BA. However, the second reflective light $L2d$ is refracted by the inclined surface HRLc_2 to propagate towards the light transmitting portion TA while propagating from the second light transmitting layer LRL_2 to the first light transmitting layer HRL_2.

That is, the refractive pattern layer PTL_2 according to an exemplary embodiment of the present disclosure can adjust a path of light reflected by an external object that is propagating toward the light blocking portion BA so that the light propagates toward the light transmitting portion TA. Accordingly, a light transmittance of the optical pattern layer CML can be improved, the amount of light incident on the light receiving element PD can be increased, and the fingerprint recognition performance of the display device 10_2 can be improved.

On the other hand, according to embodiments, a shape of the first light transmitting layer HRL_2 is not limited to the above, and can vary in other embodiments.

For example, according to an embodiment, as shown in FIG. 16, the display device 10_3 includes a refractive pattern layer PTL_3 disposed on the optical pattern layer CML. The refractive pattern layer PTL_3 includes a plurality of first light transmitting layers HRL_3 spaced apart from each other in a direction parallel to an upper surface of the refractive pattern layer PTL_3.

According to an embodiment, the first light transmitting layer HRL_3 includes an inclined surface HRLc_3. The inclined surface HRLc_3 of the first light transmitting layer HRL_3 forms an inclination angle $\theta e$ with the lower surface HRLb, and the inclination angle $\theta e$ is an acute angle. At least a portion of the inclined surface HRLc_3 of the first light transmitting layer HRL_3 overlaps the light blocking portion BA.

According to an embodiment, the second light transmitting layer LRL_3 is disposed on the first light transmitting layer HRL_3. The second light transmitting layer LRL_3 covers the first light transmitting layer HRL_3, and according to an exemplary embodiment, the second light transmitting layer LRL_2 fills at least a portion of the light transmitting portion TA.

According to an embodiment, a first reflective light $L2e$ and a second reflective light $L2f$ are incident on the refractive pattern layer PTL_3. The first reflective light $L2c$ propagates through the upper surface HRLa and the lower surface HRLb of the first light transmitting layer HRL_3 through the light transmitting portion TA to be incident on the light receiving element PD. On the other hand, the second reflective light $L2f$ is incident on the inclined surface HRLc_3 of the first light transmitting layer HRL_3. Here, the second reflective light $L2f$ is initially propagating toward the light blocking portion BA. However, the second reflective light $L2f$ is refracted by the inclined surface HRLc_3 to propagate toward the light transmitting portion TA while propagating from the second light transmitting layer LRL_2 to the first light transmitting layer HRL_3.

As described with reference to FIG. 15, according to an embodiment, the refractive pattern layer PTL_3 improves the light transmittance of the optical pattern layer CML, increases the amount of light incident on the light receiving element PD, and improves the fingerprint recognition performance of the display device 10_3.

Figure 17:
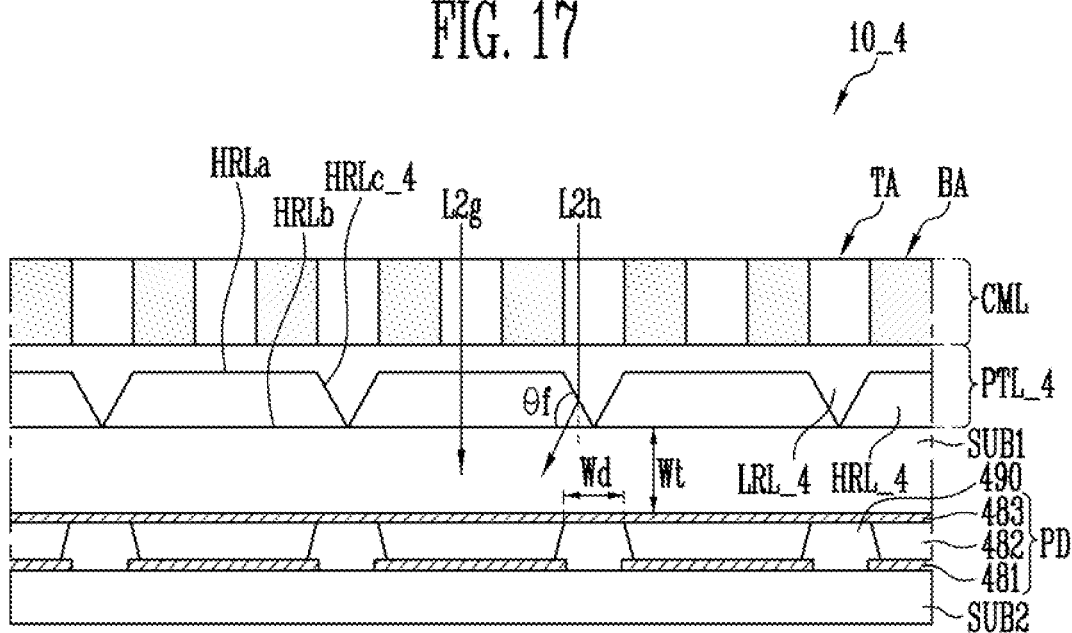
FIG. 17 is a cross-sectional view of an optical pattern layer and a refractive pattern layer according to another exemplary embodiment.

FIG. 17 is a cross-sectional view of an optical pattern layer and a refractive pattern layer according to another exemplary embodiment.

Referring to FIG. 17, according to an embodiment, the display device 10_4 includes a refractive pattern layer PTL_4 disposed under the optical pattern layer CML. The refractive pattern layer PTL_4 is a lens pattern layer that controls the path of light propagating through the optical pattern layer CML.

According to an embodiment, the refractive pattern layer PTL_4 includes a first light transmitting or lens layer HRL_4 and a second light transmitting or protective layer LRL_4.

According to an embodiment, the first light transmitting layer HRL_4 includes an upper surface HRLa, a lower surface HRLb opposite the upper surface HRLa, and an inclined surface HRLc_4 disposed between the upper surface HRLa and the lower surface HRLb and that connects the upper surface HRLa and the lower surface HRLb. The upper surface HRLa and the lower surface HRLb of the first light transmitting layer HRL_4 are substantially parallel, and the lower surface HRLb of the first light transmitting layer HRL_4 directly contacts the first substrate SUB1. However, embodiments of the present disclosure are not limited thereto, and in other embodiments, a separate support member is further disposed between the first light transmitting layer HRL_4 and the first substrate SUB1 to support the refractive pattern layer PTL_4.

According to an embodiment, the inclined surface HRLc_4 of the first light transmitting layer HRL_4 forms an inclination angle θf with the lower surface HRLb, and the inclination angle θf is an acute angle.

According to an embodiment, a plurality of light receiving elements PD are disposed under the first light transmitting layer HRL_4. At least a portion of the inclined surface HRLc_4 and the lower surface HRLb of the first light transmitting layer HRL_4 overlaps an area between the plurality of light receiving elements PD.

However, as the distance Wd between the light receiving elements PD is increased, the distance Wt between the refractive pattern layer PTL_4 and the light receiving element PD is increased.

According to an embodiment, the second light transmitting layer LRL_4 is disposed on and covers the first light transmitting layer HRL_4. The upper surface of the second light transmitting layer LRL_4 is generally flat. That is, the second light transmitting layer LRL_4 serves as a planarization layer, and provides a space on which the optical pattern layer CML is disposed.

According to an embodiment, the refractive indices of the first light transmitting layer HRL_4 and the second light transmitting layer LRL differ from each other. In detail, the refractive index of the first light transmitting layer HRL_4 is greater than the refractive index of the second light transmitting layer LLR. Accordingly, light propagating from the second light transmitting layer LRL_4 to the first light transmitting layer HRL_4 is refracted.

According to an embodiment, the refractive pattern layer PTL_4 can improve the light receiving efficiency of the light receiving elements PD. For example, a first reflective light L2g and a second reflective light L2h that have propagated through the optical pattern layer CML may be incident on the refractive pattern layer PTL_4. The first reflective light L2g propagates through the upper surface HRHR and the lower surface HRLb of the first light transmitting layer HRL_4 to be incident on the light receiving element PD.

On the other hand, according to an embodiment, the second reflective light L2h is incident on the inclined surface HRLc_4 of the first light transmitting layer HRL_4. Here, the second reflective light L2h is initially propagating toward the area between the light receiving elements PD. However, the second reflective light L2h is refracted by the inclined surface HRLc_4 to propagate toward the light receiving element PD while propagating from the second light transmitting layer LRL_4 to the first light transmitting layer HRL_4.

That is, the refractive pattern layer PTL_4 according to an exemplary embodiment of the present disclosure adjusts the path of light initially propagating toward the area between the light receiving elements PD of the light transmitting the optical pattern layer CML to instead propagate toward the light receiving element PD. Accordingly, the light receiving efficiency of the light receiving elements PD is improved, the amount of light incident on the light receiving elements PD is increased, and the fingerprint recognition performance of the display device 10_4 is improved.

FIGS. 18 to 21 are cross-sectional views of a display device according to various exemplary embodiments. The refractive pattern layers according to exemplary embodiments of FIGS. 13, 15 and 17 described above can be combined with each other. Hereinafter, combined structures will be described with reference to FIGS. 18 to 21, and duplicate descriptions will be omitted.

Figure 18:
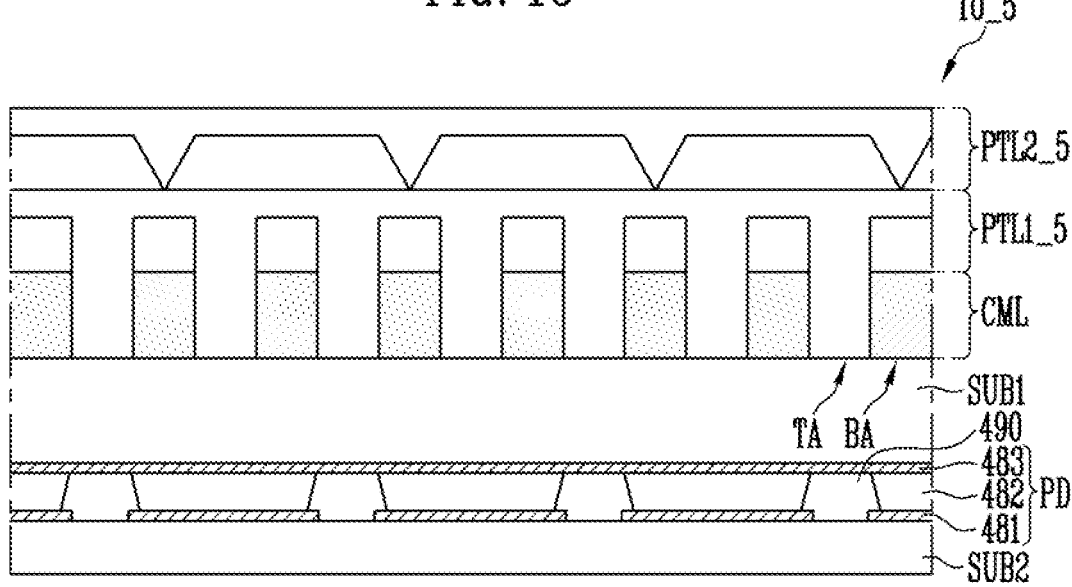
FIGS. 18 to 21 are cross-sectional views of a display device according to various exemplary embodiments.

For example, as shown in FIG. 18, according to an embodiment, the display device 10_5 includes a refractive pattern layer PTL_5 disposed on the optical pattern layer CML. The refractive pattern layer PTL_5 includes a first refractive pattern layer PTL1_5 and a second refractive pattern layer PTL2_5 disposed on the first refractive pattern layer PTL1_5.

Since the first refractive pattern layer PTL1_5 is substantially the same as the refractive pattern layer PTL shown in FIG. 13, and the second refractive pattern layer PTL2_5 is substantially the same as the refractive pattern layer PTL_2 shown in FIG. 15, duplicate descriptions thereof will be omitted.

In the display device 10_5 according to an exemplary embodiment of FIG. 18, the second refractive pattern layer PTL2_5 adjusts the path of light reflected by an external object that is propagating toward the light blocking portion BA by refraction to propagate toward the light transmitting portion TA. Accordingly, the light transmittance of the optical pattern layer CML is improved, and the fingerprint recognition performance of the display device 10_5 is improved. In addition, since the cutoff angle of the optical pattern layer CML can be adjusted through the first refractive pattern layer PTL1_5, the fingerprint detection capability of the display device 10_5 is improved.

Figure 19:
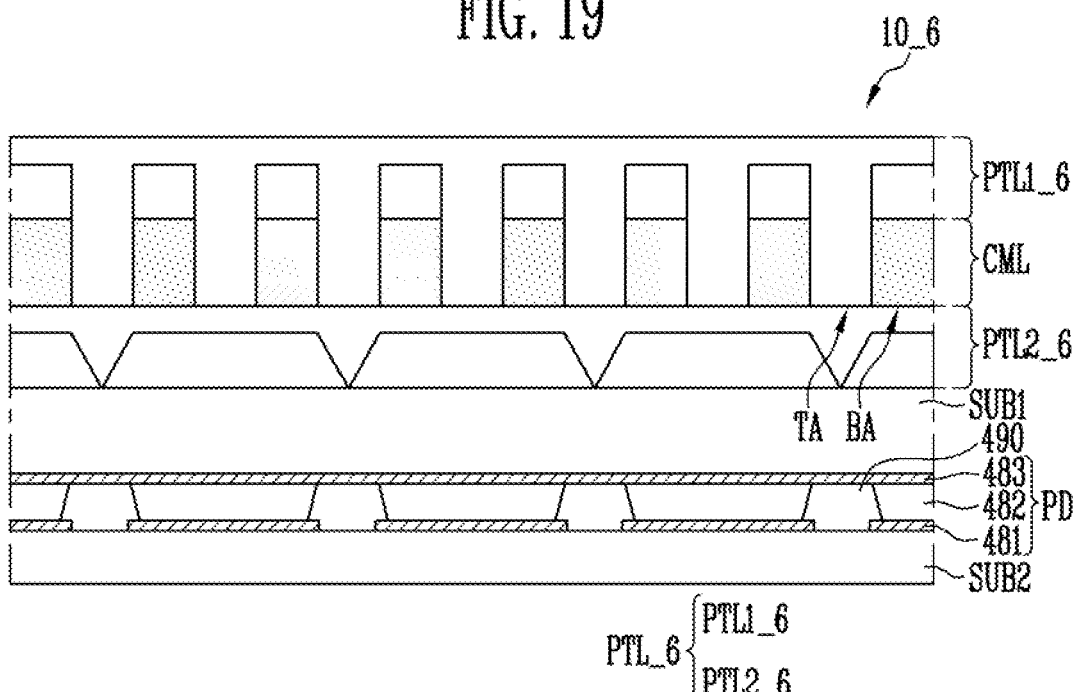

For another example, as shown in FIG. 19, according to an embodiment, the display device 10_6 includes a refractive pattern layer PTL_6 disposed on and under the optical pattern layer CML. The refractive pattern layer PTL_6 includes a first refractive pattern layer PTL1_6 disposed on the optical pattern layer CML and a second refractive pattern layer PTL2_6 disposed under the optical pattern layer CML.

According to an embodiment, since the first refractive pattern layer PTL1_6 is substantially the same as the refractive pattern layer PTL shown in FIG. 13, and the second refractive pattern layer PTL2_6 is substantially the same as the refractive pattern layer PTL_4 shown in FIG. 17, duplicate descriptions thereof will be omitted.

In the display device 10_6 according to an exemplary embodiment of FIG. 19, the second refractive pattern layer PTL2_6 adjusts the path of light propagating through the optical pattern layer CML toward the area between the light receiving elements PD by refraction to instead propagate toward the light receiving element PD. Accordingly, the light receiving efficiency of the light receiving elements PD is improved, and the fingerprint recognition performance of the display device 10_6 is improved. In addition, since the cutoff angle of the optical pattern layer CML can be adjusted through the first refractive pattern layer PTL1_6, the fingerprint detection capability of the display device 10_6 is improved.

Figure 20:
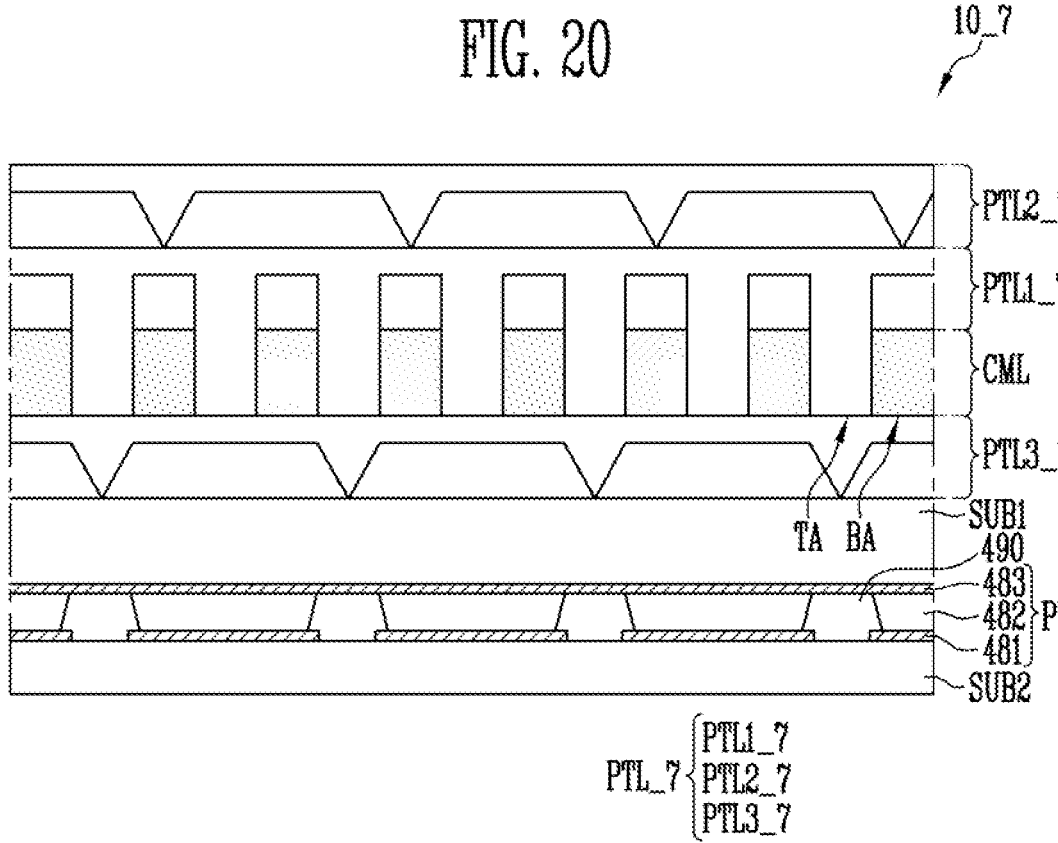

For another example, according to an embodiment, as shown in FIG. 20, the display device 10_7 includes a refractive pattern layer PTL_7 disposed above and below the optical pattern layer CML. The refractive pattern layer PTL_7 includes a first refractive pattern layer PTL1_7 and a second refractive pattern layer PTL2_7 disposed on the optical pattern layer CML, and a third refractive pattern layer PTL3_7 disposed under the optical pattern layer CML.

Since the first refractive pattern layer PTL1_7 is substantially the same as the refractive pattern layer PTL described in FIG. 13, the second refractive pattern layer PTL2_7 is substantially the same as the refractive pattern layer PTL_2 described in FIG. 15, and the third refractive pattern layer PTL3_7 is substantially the same as the refractive pattern layer PTL_4 described in FIG. 17, duplicate descriptions thereof will be omitted.

The second refractive pattern layer PTL2_7 according to an exemplary embodiment of FIG. 20 adjusts the path of light reflected by an external object that is propagating toward the light blocking portion BA by refraction top instead propagate toward the light transmitting portion TA. Accordingly, the light transmittance of the optical pattern layer CML is improved, and the fingerprint recognition performance of the display device 10_7 is improved. In addition, the third refractive pattern layer PTL3_7 adjusts the path of light propagating through the optical pattern layer CML toward the area between the light receiving elements PD by refraction to instead propagate toward the light receiving element PD. Accordingly, the light receiving efficiency of the light receiving elements PD is improved, and the fingerprint recognition performance of the display device 10_7 is further improved. In addition, since the cutoff angle of the optical pattern layer CML can be adjusted through the first refractive pattern layer PTL1_7, the fingerprint detection capability of the display device 10_7 is improved.

Figure 21:
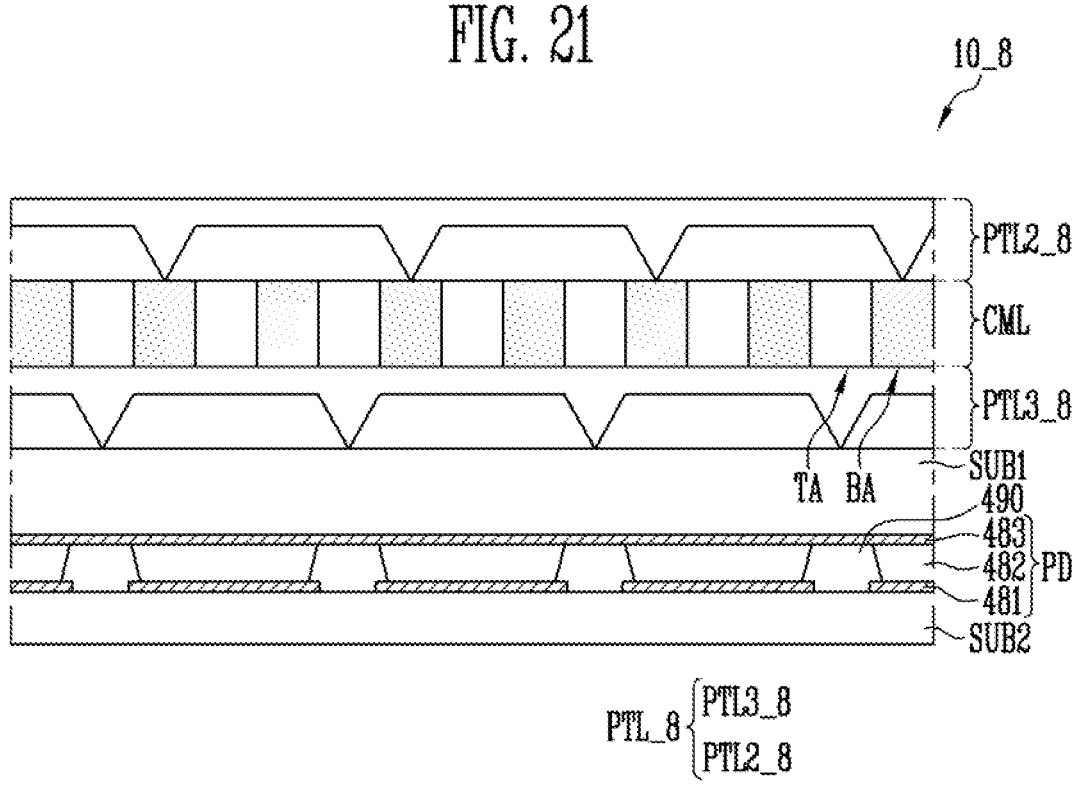

For another example, as shown in FIG. 21, according to an embodiment, the display device 10_8 includes a refractive pattern layer PTL_8 disposed above and below the optical pattern layer CML. The refractive pattern layer PTL_8 include a second refractive pattern layer PTL2_8 disposed on the optical pattern layer CML and a third refractive pattern layer PTL3_8 disposed under the optical pattern layer CML.

Since the second refractive pattern layer PTL2_8 is substantially the same as the refractive pattern layer PTL_2 described in FIG. 15, and the third refractive pattern layer PTL3_8 is substantially the same as the refractive pattern layer PTL_4 described in FIG. 17, duplicate descriptions thereof will be omitted.

Since the display device 10_8 according to an exemplary embodiment of the present disclosure differs from the display device 10_7 of FIG. 20 in that the display device 10_8 does not include the first refractive pattern layer PTL1_7, and other configurations thereof are substantially the same as those of an exemplary embodiment of FIG. 20, detailed descriptions thereof will be omitted.

FIGS. 22 to 25 are cross-sectional views that illustrate process steps of a manufacturing method of a display device according to an exemplary embodiment. FIGS. 22 to 25 are cross-sectional views that illustrate a method of manufacturing the display device of FIGS. 1 to 13, and the same constituent elements as those of FIGS. 1 to 13 are denoted by the same reference numerals and detailed reference numerals are omitted.

Figure 22:
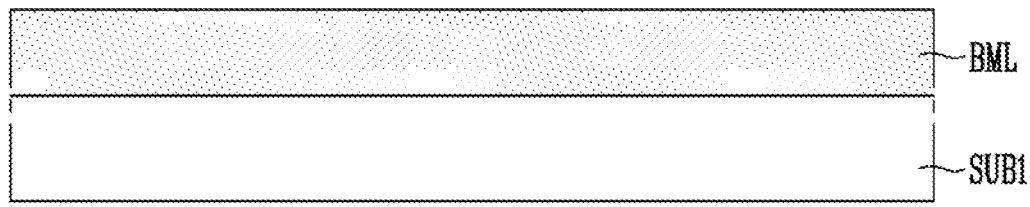
FIGS. 22 to 25 are cross-sectional views that illustrate process steps of a manufacturing method of a display device according to an exemplary embodiment.

First, according to an embodiment, referring to FIG. 22, a light blocking material layer BML is formed on the first substrate SUB1. The light blocking material layer BML is formed using an organic blocking material and a metal blocking material. For example, the organic blocking material includes at least one of carbon black (CB) or titanium black (TiBK), but embodiments are not limited thereto. In addition, the metal blocking material includes at least one of chromium, chromium oxide or chromium nitride, but embodiments are not limited thereto.

For example, according to an embodiment, a step of forming the light blocking material layer BML can be performed by Inkjet printing or spin coating by using polyacrylates resin, epoxy resin, phenolic resin, polyamides resins, polyimide resin, unsaturated polyesters resin, poly phenylenethers resin, polyphenylenesulfides resin, or benzocyclobutene (BCB) containing the light blocking material, but embodiments are not limited thereto.

Figure 23:
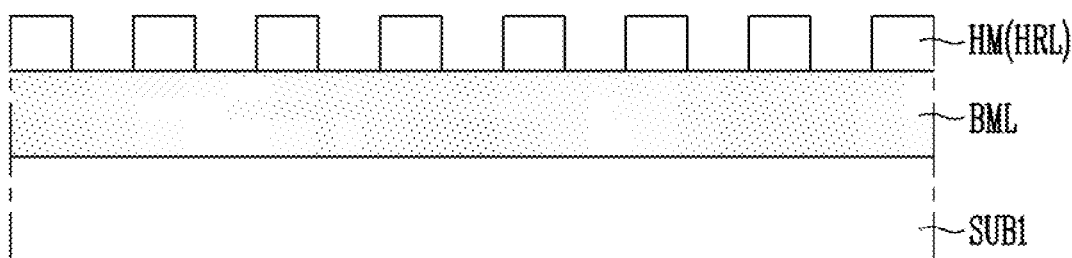
Figure 24:
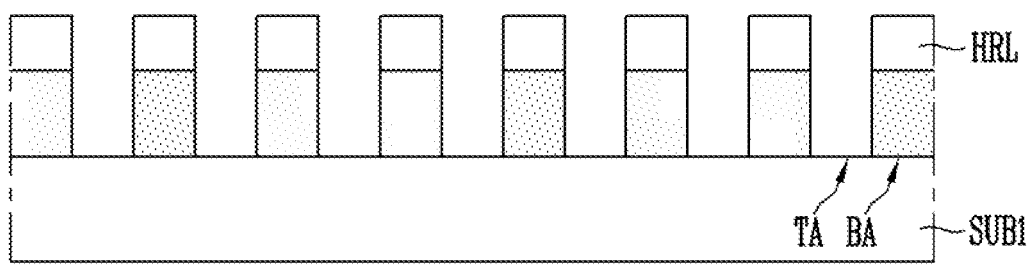

Next, according to an embodiment, referring to FIGS. 23 and 24, the first light transmitting layer HRL is formed on the light blocking material layer BML, and the light blocking material layer BML is etched to form a light blocking portion BA and a light transmitting portion TA. The first light transmitting layer HRL has a pattern that is used as a hard mask (HM) for etching the light blocking material layer BML. That is, the first light transmitting layer HRL is formed at positions that correspond to the light blocking portions BA and define the light transmitting portions TA.

For example, according to an embodiment, a step of forming the first light transmitting layer HRL can be performed by a plasma chemical vapor deposition (PECVD). The first light transmitting layer HRL is formed of an inorganic layer that includes inorganic materials such as silicon nitride (SiNx), silicon oxy nitride (SiON), silicon oxide (SiOx), titanium oxide (TiOx), or aluminum oxide (AlOx), but embodiments are not limited thereto, and the first light transmitting layer HRL may be formed of an organic layer that includes inorganic particles.

Figure 25:
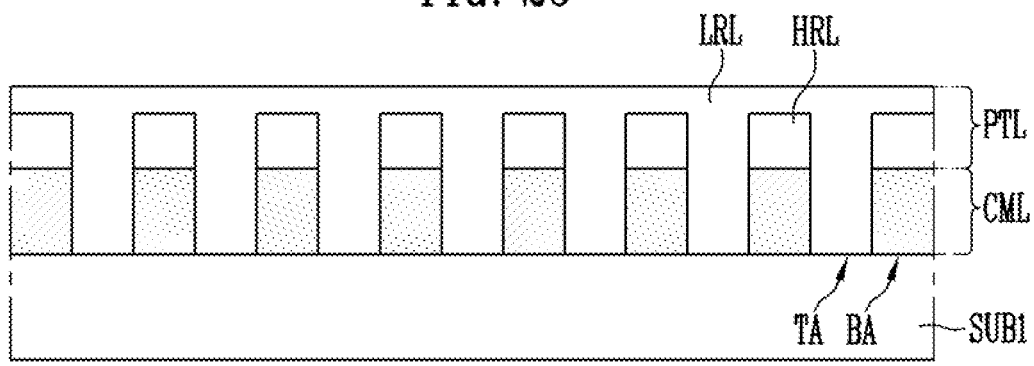

Next, referring to FIG. 25, according to an embodiment, a second light transmitting layer LRL is formed on the first light transmitting layer HRL. The second light transmitting layer LRL fills the light transmitting portion TA of the optical pattern layer CML and covers the first light transmitting layer HRL. The second light transmitting layer LRL completely fills the light transmitting portion TA, and directly contacts the first substrate SUB1, but embodiments are not limited thereto. For example, air layers may be formed between the second light transmitting layer LRL and the first substrate SUB1.

According to an embodiment, the upper surface of the second light transmitting layer LRL is generally flat. That is, the second light transmitting layer LRL serves as a planarization layer that compensates for steps in configurations disposed thereunder. Therefore, light incident on the upper surface of the second light transmitting layer LRL can uniformly propagate toward the optical pattern layer CML.

For example, according to an embodiment, a step of forming the second light transmitting layer LRL can be performed by an Inkjet printing or a spin coating process by using transparent organic materials such as polyacrylates resin, epoxy resin, phenolic resin, polyamides resin, polyimides rein, unsaturated polyesters resin, poly phenylenethers resin, polyphenylenesulfides resin or benzocyclobutene (BCB), but embodiments are not limited thereto.

Next, according to an embodiment, as shown in FIG. 2, a fingerprint sensor layer FPSL is formed under the first substrate SUB1 and a display panel 100 is formed on the optical pattern layer CML to complete the display device. At this time, the fingerprint sensor layer FPSL is attached through a separate process after the optical pattern layer CML and refractive pattern layer PTL are formed, as described above, but embodiments are not limited thereto. For example, the optical pattern layer CML and the refractive pattern layer PTL can be formed directly on the fingerprint sensor layer FPSL.

According to a manufacturing method of a display device according to an exemplary embodiment of the present disclosure, since the light blocking material layer BML is etched by using as a hard mask a first light transmitting layer HRL that includes a high reflective index material, a separate removal process of the hard mask HM is not required, and the manufacturing process of the display device is simplified. Accordingly, a manufacturing time and cost of the display device that includes the refractive pattern layer PTL can be reduced.

While exemplary embodiments of the disclosure have been described with reference to the attached drawings, those with ordinary skill in the technical field of the present disclosure will understand that embodiments of the present disclosure can be implemented in other specific forms without changing the technical ideas or essential features. Exemplary embodiments should be considered in descriptive sense only and not for purposes of limitation.

What is claimed is:

1. A display device, comprising:
   a fingerprint sensor layer that receives light reflected by an external object;
   a substrate disposed on the fingerprint sensor layer;
   an optical pattern layer disposed on the substrate and that includes a light blocking portion and a light transmitting portion that passes through the light blocking portion in one direction;
   a first light transmitting layer with a first refractive index and that is disposed on the light blocking portion but not on the light transmitting portion;
   a second light transmitting layer with a second refractive index different from the first refractive index and that is disposed on the first light transmitting layer; and
   a light emitting element layer disposed on the second light transmitting layer.

2. The display device of claim 1, wherein
   the first light transmitting layer includes an opening that completely penetrates the first light transmitting layer and overlaps the light transmitting portion, and
   the second light transmitting layer fills the light transmitting portion and the opening of the first light transmitting layer.

3. The display device of claim 1, wherein
   the first refractive index is greater than the second refractive index.

4. The display device of claim 3, wherein
   the first light transmitting layer includes at least one of an inorganic material layer that contains at least one of silicon nitride, silicon oxy nitride, silicon oxide, titanium oxide, or aluminum oxide, or an organic material layer that contains an inorganic particle.

5. The display device of claim 3, wherein
   the second light transmitting layer contains a transparent organic material.

6. The display device of claim 3, wherein
   a refractive index ratio of the first light transmitting layer and the second light transmitting layer is expressed by refractive index ratio=the second refractive index/the first refractive index, wherein the refractive index ratio is 0.9775 or less.

7. The display device of claim 1, wherein
   the light blocking portion includes at least one of an organic blocking material or a metal blocking material.

8. The display device of claim 1, further comprising:
   a lens layer disposed between the second light transmitting layer and the light emitting element layer and that includes an inclined surface,
   wherein the inclined surface of the lens layer overlaps the light blocking portion, and
   light reflected by the external object and that is incident on the inclined surface is refracted toward the light transmitting portion.

9. The display device of claim 1, further comprising:
   a first lens layer disposed between the substrate and the optical pattern layer and that includes a first inclined surface,
   wherein the fingerprint sensor layer includes a plurality of light receiving elements,
   the inclined surface overlaps an area between the plurality of light receiving elements, and
   light transmitting the light transmitting portion and that is incident on the first inclined surface is refracted toward at least one of the plurality of light receiving elements.

10. The display device of claim 9, further comprising:
    a second lens layer disposed between the second light transmitting layer and the light emitting element layer and that includes a second inclined surface,
    wherein the second inclined surface of the second lens layer overlaps the light blocking portion, and
    light reflected by the external object and that is incident on the second inclined surface is refracted toward the light transmitting portion.

* * * * *